US012813132B2

(12) United States Patent
Park et al.

(10) Patent No.: US 12,813,132 B2
(45) Date of Patent: Nov. 24, 2026

(54) DISPLAY DEVICE

(71) Applicant: Samsung Display Co., Ltd., Yongin-si (KR)

(72) Inventors: Jonghwa Park, Yongin-si (KR); Kyungho Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 118 days.

(21) Appl. No.: 18/913,435

(22) Filed: Oct. 11, 2024

(65) Prior Publication Data

US 2025/0301882 A1 Sep. 25, 2025

(30) Foreign Application Priority Data

Mar. 22, 2024 (KR) ........................ 10-2024-0039976

(51) Int. Cl.

*H10K 59/80* (2023.01)
*H10K 59/35* (2023.01)
*H10K 77/10* (2023.01)
*H10K 102/00* (2023.01)

(52) U.S. Cl.

CPC ....... *H10K 59/8722* (2023.02); *H10K 59/353* (2023.02); *H10K 77/111* (2023.02); *H10K 2102/311* (2023.02)

(58) Field of Classification Search

CPC ............. H10K 59/8722; H10K 59/353; H10K 77/111; H10K 2102/311

See application file for complete search history.

(56) References Cited

U.S. PATENT DOCUMENTS

| | | | | |
|---|---|---|---|---|
| 11,614,840 | B2 * | 3/2023 | Kwon | H10K 50/8445 345/174 |
| 2005/0243577 | A1 * | 11/2005 | Moon | H10H 20/853 257/E33.059 |
| 2016/0378224 | A1 | 12/2016 | Kwon et al. | |
| 2020/0119302 | A1 * | 4/2020 | Kim | H10K 59/122 |
| 2020/0193899 | A1 | 6/2020 | Li et al. | |
| 2020/0251536 | A1 * | 8/2020 | Zhao | H10K 59/353 |
| 2020/0267246 | A1 * | 8/2020 | Song | G06F 1/1652 |
| 2020/0403170 | A1 | 12/2020 | Xue et al. | |
| 2021/0408159 | A1 | 12/2021 | Zhang et al. | |

(Continued)

FOREIGN PATENT DOCUMENTS

| | | | |
|---|---|---|---|
| CN | 112614428 | B | 5/2022 |
| CN | 112863341 | B | 5/2022 |

(Continued)

OTHER PUBLICATIONS

International Search Report dated Mar. 6, 2025, corresponding to PCT Patent Application No. PCT/KR2024/019567, 3 pages.

*Primary Examiner* — Mary Ellen Bowman

(74) *Attorney, Agent, or Firm* — Womble Bond Dickinson (US) LLP

(57) ABSTRACT

A display device includes: a display area and a non-display area; a substrate; a plurality of light-emitting elements on the substrate; and a cover layer including: a cover frame on the substrate, and including an opaque material; and a plurality of cover openings in the cover frame to overlap with the plurality of light-emitting elements. The plurality of light-emitting elements are located at different intervals, and the plurality of cover openings are located at equal intervals.

20 Claims, 24 Drawing Sheets

(56) References Cited

U.S. PATENT DOCUMENTS

| | | | | |
|---|---|---|---|---|
| 2022/0045305 | A1 | 2/2022 | Song et al. | |
| 2022/0187871 | A1 * | 6/2022 | Yamazaki | G06F 1/1652 |
| 2022/0254850 | A1 * | 8/2022 | Kim | H10D 86/411 |
| 2022/0320223 | A1 | 10/2022 | Wang | |
| 2023/0109049 | A1 | 4/2023 | Wang | |
| 2023/0422558 | A1 * | 12/2023 | An | H10K 59/122 |
| 2024/0397789 | A1 * | 11/2024 | Park | H10K 59/873 |
| 2025/0301858 | A1 * | 9/2025 | Lee | H10K 77/111 |
| 2025/0301882 | A1 * | 9/2025 | Park | H10K 59/8722 |

FOREIGN PATENT DOCUMENTS

| | | | |
|---|---|---|---|
| JP | 2021-26094 | A | 2/2021 |
| KR | 10-2017-0077942 | A | 7/2017 |
| KR | 10-2020-0144204 | A | 12/2020 |
| KR | 10-2021-0036037 | A | 4/2021 |
| KR | 10-2276136 | B1 | 7/2021 |
| KR | 10-2023-0044738 | A | 4/2023 |
| KR | 10-2600226 | B1 | 11/2023 |
| KR | 10-2024-0001797 | A | 1/2024 |
| WO | WO 2019/237734 | A1 | 12/2019 |
| WO | WO 2020/019859 | A1 | 1/2020 |
| WO | WO 2020/227867 | A1 | 11/2020 |
| WO | WO 2022/151582 | A1 | 7/2022 |
| WO | WO 2022/151583 | A1 | 7/2022 |
| WO | WO 2022/227446 | A1 | 11/2022 |

* cited by examiner

DISPLAY DEVICE

CROSS-REFERENCE TO RELATED APPLICATION

The present application claims priority to and the benefit of Korean Patent Application No. 10-2024-0039976, filed on Mar. 22, 2024, in the Korean Intellectual Property Office, the entire disclosure of which is incorporated by reference herein.

BACKGROUND

1. Field

Aspects of one or more embodiments of the present disclosure relate to a display device, and in particular, to a flexible display device.

2. Description of the Related Art

Display devices may visually display electrical signals. Various display devices have been introduced that have excellent characteristics, such as thinness, light weight, and low power consumption. For example, flexible display devices that may be bent, folded, or rolled in the shape of a roll have been introduced. Recently, display devices having various structures, such as stretchable display devices that may be changed in various forms, are being researched.

The above information disclosed in this Background section is for enhancement of understanding of the background of the present disclosure, and therefore, it may contain information that does not constitute prior art.

SUMMARY

One or more embodiments of the present disclosure may be directed to a display device, for example, such as a flexible display device.

Additional aspects and features will be set forth, in part, in the description that follows, and in part, may be apparent from the description, or may be learned by practicing one or more of the presented embodiments of the present disclosure.

According to one or more embodiments of the present disclosure, a display device includes: a display area and a non-display area; a substrate; a plurality of light-emitting elements on the substrate; and a cover layer including: a cover frame on the substrate, and including an opaque material; and a plurality of cover openings in the cover frame to overlap with the plurality of light-emitting elements. The plurality of light-emitting elements are located at different intervals, and the plurality of cover openings are located at equal intervals.

In some embodiments, the plurality of cover openings may be located symmetrically with respect to a first center line and a second center line, the first center line being a virtual center line passing through a center of the display area in a first direction, and the second center line being a virtual center line passing through the center of the display area in a second direction crossing the first direction.

In some embodiments, the plurality of light-emitting elements may include: a plurality of first light-emitting elements linearly located along the first center line; and a plurality of second light-emitting elements spaced from the first center line in the second direction, and linearly located along a first line, the first line being a virtual line convex in the second direction.

In some embodiments, a distance between the first center line and the first line may decrease gradually along the first direction based on the second center line.

In some embodiments, the plurality of light-emitting elements may further include a plurality of third light-emitting elements linearly located along a second line, the second line being a virtual line symmetrical with respect to the first line based on the first center line.

In some embodiments, a modulus of the cover frame may be less than a modulus of the substrate.

In some embodiments, in a plan view, a size of each of the plurality of cover openings may be greater than a size of each of the plurality of light-emitting elements.

In some embodiments, the cover layer may further include a support portion to support the cover frame from the substrate.

In some embodiments, the support portion may include a plurality of support portions, and at least one of the plurality of support portions may be located in the display area.

In some embodiments, the cover frame may include at least one of a thermoplastic polyurethane (TPU), a thermoplastic polyethylene (TPE), or a silicon rubber.

According to one or more embodiments of the present disclosure, a display device configured to be converted between a first structure and a second structure extending from the first structure, includes: a substrate; a plurality of light-emitting elements on the substrate; and a cover layer including: a cover frame on the substrate, and including an opaque material; and a plurality of cover openings located in the cover frame to overlap with the plurality of light-emitting elements. In the second structure, a distance between the plurality of light-emitting elements is uniform in comparison with that of the first structure.

In some embodiments, the plurality of light-emitting elements may include: a plurality of first light-emitting elements linearly located along a first center line, the first center line being a virtual center line extending in a first direction; and a plurality of second light-emitting elements spaced from the first center line in a second direction crossing the first direction, and linearly located along a first line, the first line being a virtual line convex in the second direction.

In some embodiments, in the second structure, a curvature of the first line may decrease in comparison with that of the first structure.

In some embodiments, in the second structure, a distance between the first center line and the first line may decrease in comparison with that of the first structure.

In some embodiments, the plurality of light-emitting elements may further include a plurality of third light-emitting elements linearly located along a second line, the second line being a virtual line symmetrical with respect to the first line based on the first center line.

In some embodiments, a modulus of the cover frame may be less than a modulus of the substrate.

In some embodiments, in a plan view, a size of each of the plurality of cover openings may be greater than a size of each of the plurality of light-emitting elements.

In some embodiments, the cover layer may further include a support portion to support the cover frame from the substrate.

In some embodiments, the support portion may include a plurality of support portions spaced apart from each other.

In some embodiments, the cover frame may include at least one of a thermoplastic polyurethane (TPU), a thermoplastic polyethylene (TPE), or a silicon rubber.

However, the present disclosure is not limited to the above aspects and features, and the above and additional aspects and features will be set forth, in part, in the detailed description that follows with reference to the drawings, and in part, may be apparent therefrom, or may be learned by practicing one or more of the presented embodiments of the present disclosure.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
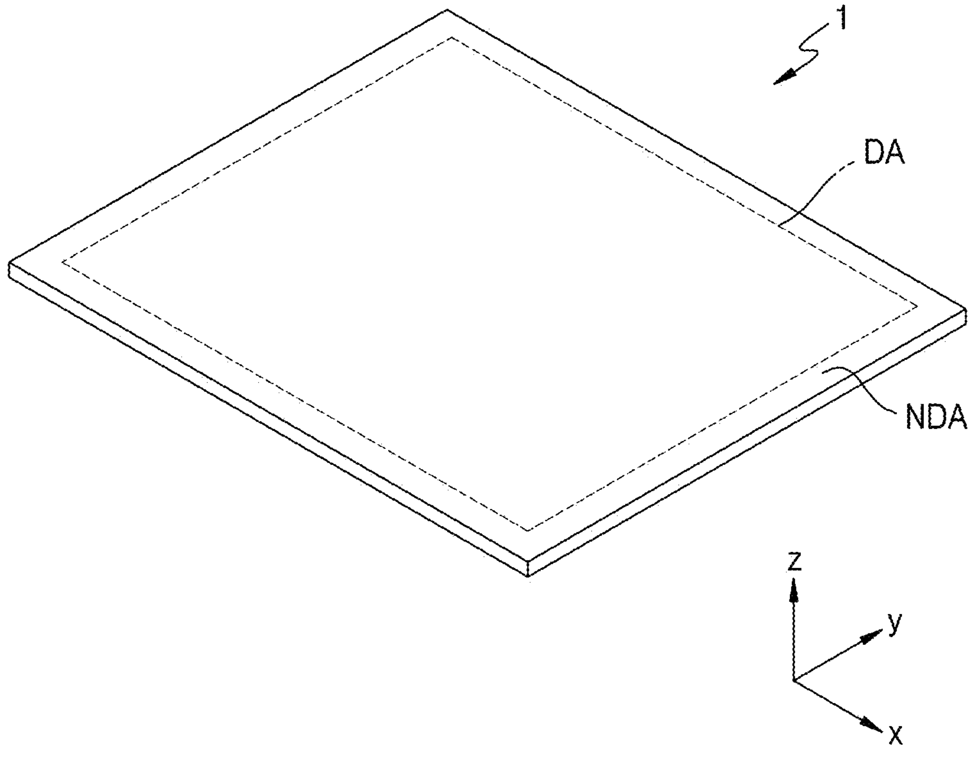
FIG. 1 is a perspective view schematically illustrating a display device according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

Further, as would be understood by a person having ordinary skill in the art, in view of the present disclosure in its entirety, each suitable feature of the various embodiments of the present disclosure may be combined or combined with each other, partially or entirely, and may be technically interlocked and operated in various suitable ways, and each embodiment may be implemented independently of each other or in conjunction with each other in any suitable manner, unless otherwise stated or implied.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Further, it should be expected that the shapes shown in the figures may vary in practice depending, for example, on tolerances and/or manufacturing techniques. Accordingly, the embodiments of the present disclosure should not be construed as being limited to the specific shapes shown in the figures, and should be construed considering changes in shapes that may occur, for example, as a result of manufacturing. As such, the shapes shown in the drawings may not depict the actual shapes of areas of the device, and the present disclosure is not limited thereto.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2A:
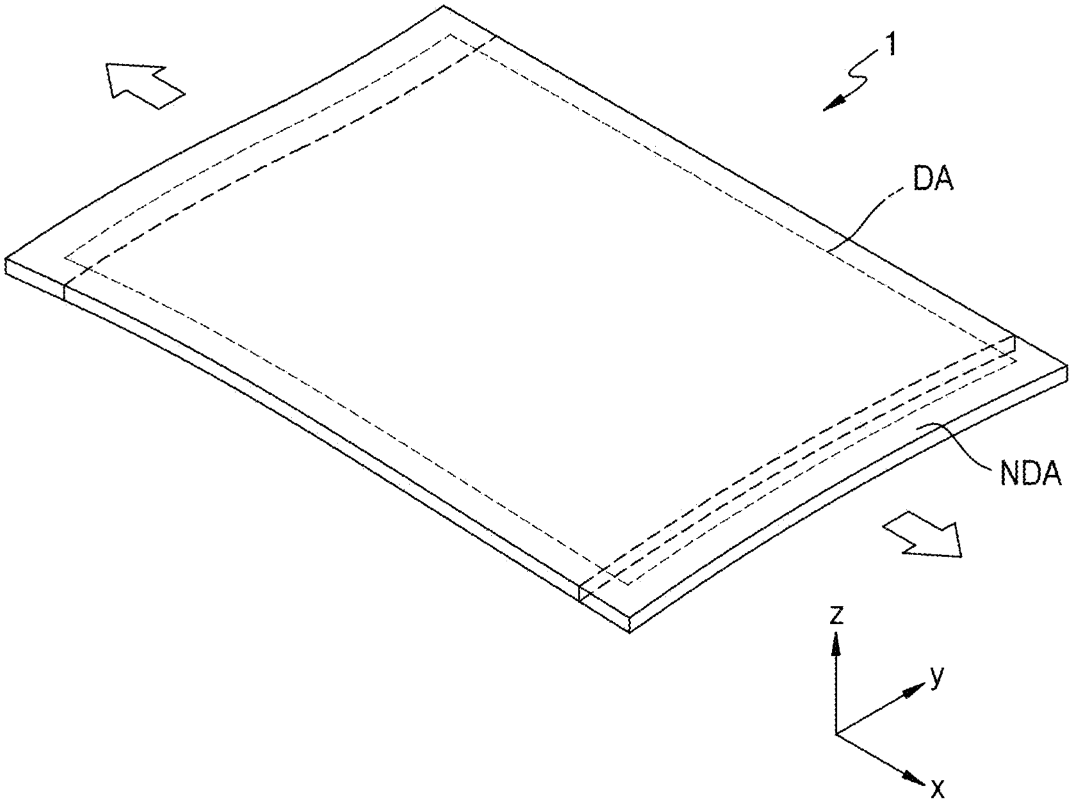
FIGS. 2A and 2B are perspective views illustrating a state in which the display device of FIG. 1 is elongated in a first direction.
Figure 2B:
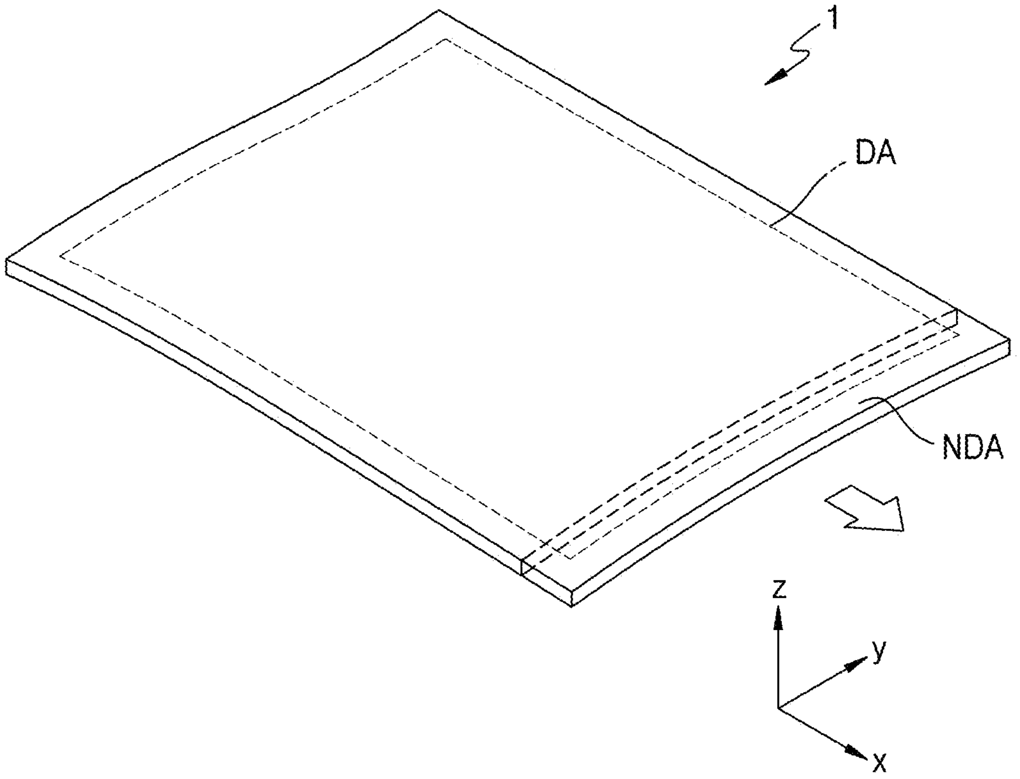
Figure 2C:
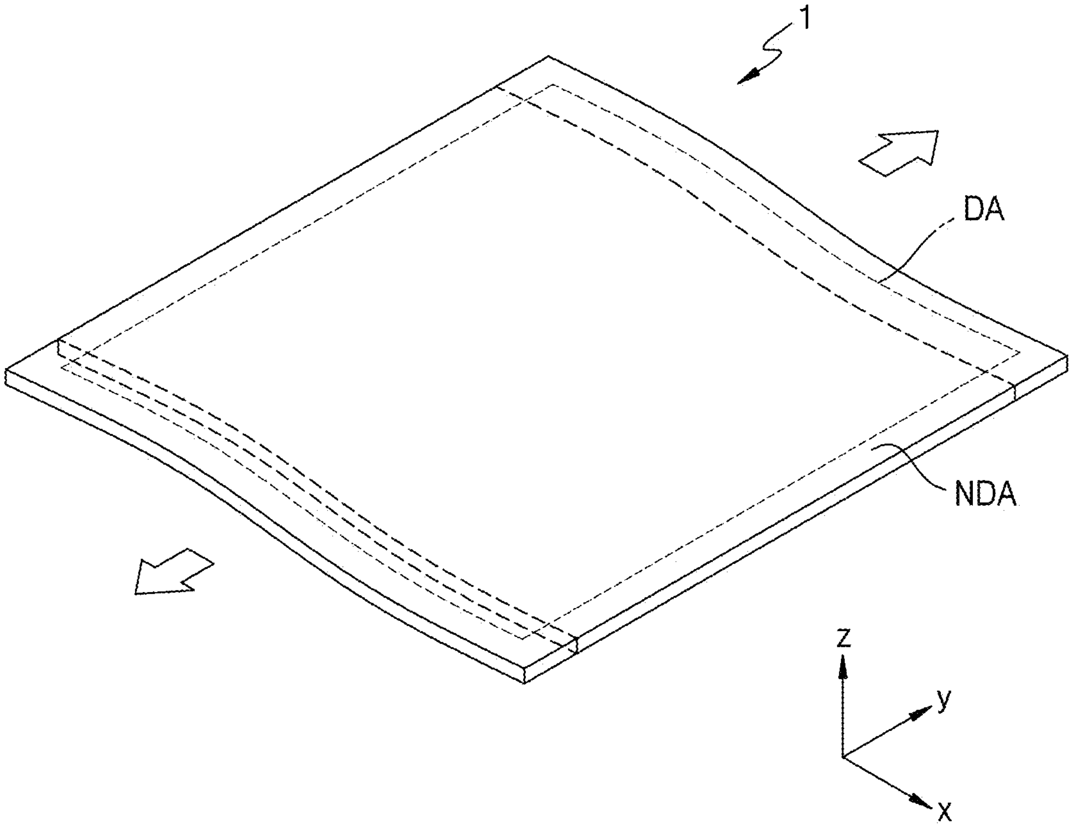
FIG. 2C is a perspective view illustrating a state in which the display device of FIG. 1 is elongated in a second direction.
Figure 2D:
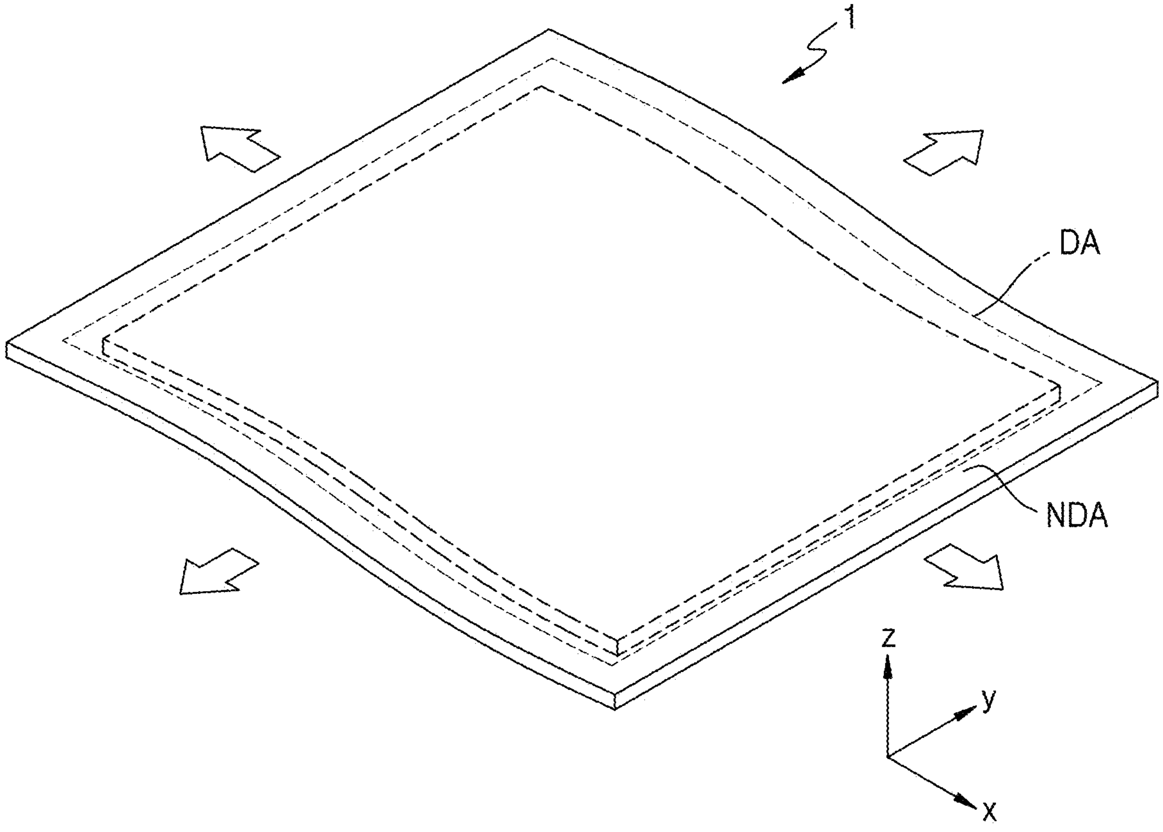
FIG. 2D is a perspective view illustrating a state in which the display device of FIG. 1 is elongated in the first direction and the second direction.
Figure 2E:
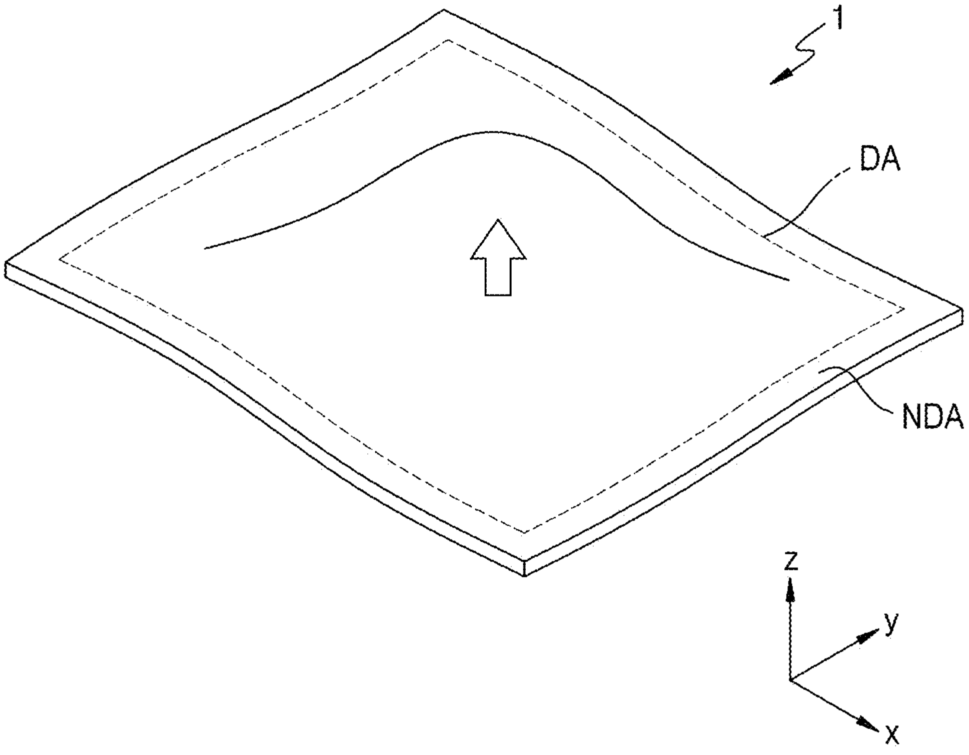
FIG. 2E is a perspective view illustrating a state in which the display device of FIG. 1 is elongated in a third direction.

FIG. 1 is a perspective view schematically illustrating a display device 1 according to an embodiment. FIGS. 2A and 2B are perspective views illustrating a state in which the display device 1 of FIG. 1 is elongated in a first direction. FIG. 2C is a perspective view illustrating a state in which the display device 1 of FIG. 1 is elongated in a second direction. FIG. 2D is a perspective view illustrating a state in which the display device 1 of FIG. 1 is elongated in the first direction and the second direction. FIG. 2E is a perspective view illustrating a state in which the display device 1 of FIG. 1 is elongated in a third direction.

Referring to FIG. 1, the display device 1 may include a display area DA and a non-display area NDA. A plurality of pixels may be included in the display area DA. The display device 1 may provide an image (e.g., a certain or predetermined image) by using light emitted from the plurality of pixels. The non-display area NDA may be outside the display area DA. The non-display area NDA may be an area in which no image is provided, and may surround (e.g., around a periphery of) the display area DA entirely.

The display device 1 may be elongated or shortened in various directions. The display device 1 may be elongated in a first direction (e.g., the x-direction and/or the −x direction) by an external force applied by an external object or a user. In an embodiment, the display area DA and/or the non-display area NDA of the display device 1 may be elongated in the first direction (e.g., the x direction and/or the −x direction), as shown in FIGS. 2A and 2B. For example, the display area DA and/or the non-display area NDA of the display device 1 may be elongated in the x direction and the −x direction, as shown in FIG. 2A, or the display area DA and/or the non-display area NDA of the display device 1 may be elongated in the x direction while one side of the display device 1 is fixed, as shown in FIG. 2B.

The display device 1 may be elongated in a second direction (e.g., the y direction and/or the −y direction) by an external force applied by the external object or the user. In an embodiment, the display area DA and/or the non-display area NDA of the display device 1 may be elongated in the y direction and the −y direction, as shown in FIG. 2C. In another embodiment, the display area DA and/or the non-display area NDA of the display device 1 may be elongated in the y direction or the −y direction while one side of the display device 1 is fixed.

The display device 1 may be elongated in a plurality of directions (e.g., the first direction and the second direction) by an external force applied by the external object or a part of the user (e.g., a part of a human body). The display area DA and/or the non-display area NDA of the display device 1 may be elongated in the +x direction and the ty direction, as shown in FIG. 2D.

The display device 1 may be elongated in a third direction (e.g., the z direction and/or the −z direction) by an external force applied by the external object or the user. In an embodiment, as shown in FIG. 2E, a part of the display device 1 (e.g., a partial region of the display area DA) may protrude in the z direction. In another embodiment, a part of the display device 1 (e.g., a partial region of the display area DA) may protrude in the −z direction (e.g., may be recessed in the z direction).

FIGS. 2A through 2E illustrate that the display device 1 is elongated in the first direction, the second direction, and/or the third direction, but the present disclosure is not limited thereto. In another embodiment, the display device 1 may be variously modified into atypical shapes, such as bending or twisting with two or more axes.

Figure 3:
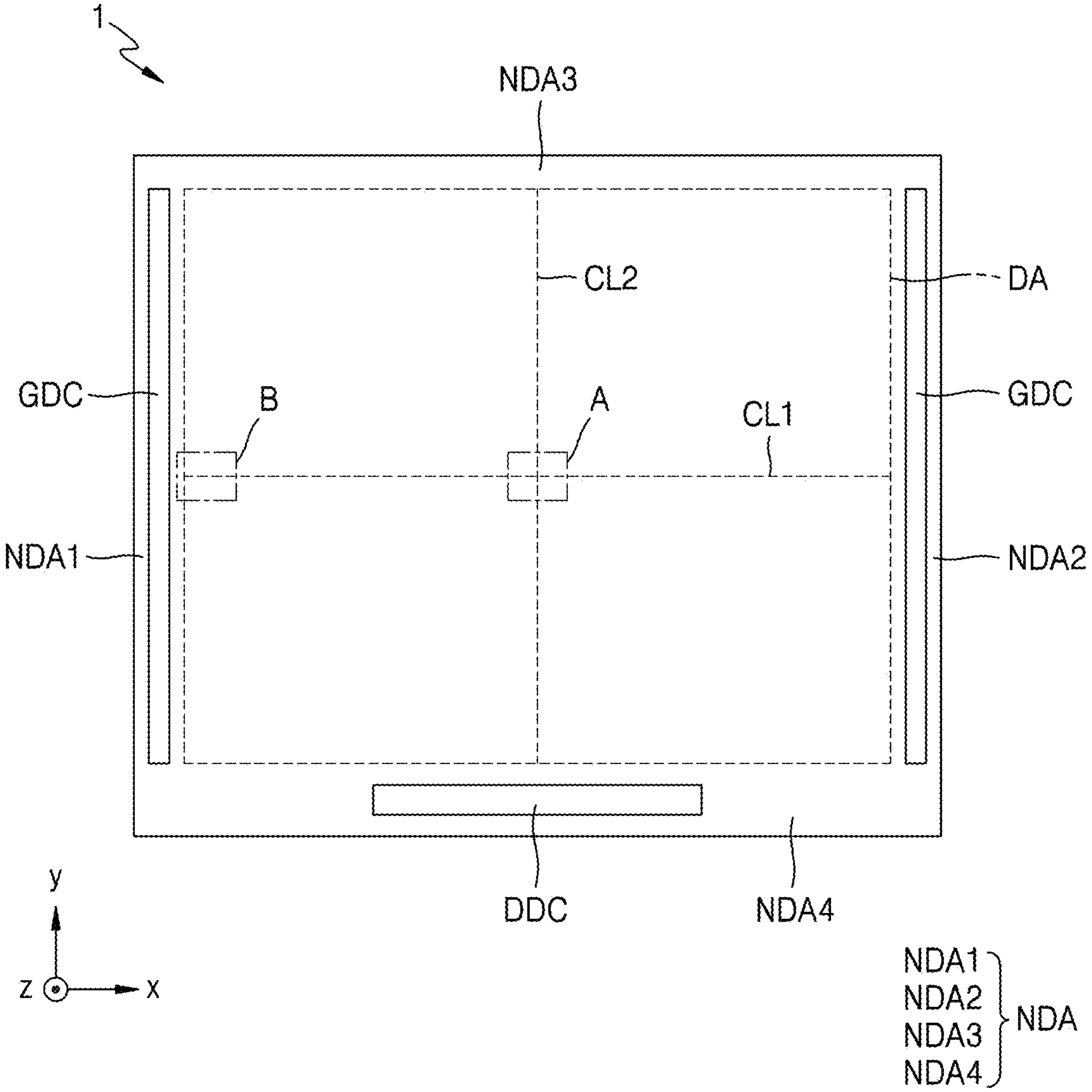
FIG. 3 is a plan view schematically illustrating a display device according to an embodiment.

FIG. 3 is a cross-sectional view schematically illustrating the display device 1 according to an embodiment.

A plurality of pixels may be arranged in the display area DA of the display device 1. Each of the plurality of pixels may include sub-pixels that emit light of different colors from each other. Light-emitting elements corresponding to the sub-pixels, respectively, may be arranged in the display area DA. A circuit for providing electrical signals to transistors electrically connected to the light-emitting elements may be arranged in the non-display area NDA around the display area DA. A gate driving circuit GDC may be arranged in each of a first non-display area NDA1 and a second non-display area NDA2 at both sides (e.g., at opposite sides) of the display DA therebetween. The gate driving circuit GDC may include drivers for providing electrical signals to a gate electrode of each of the transistors electrically connected to the light-emitting elements. FIG. 3 illustrates that the gate driving circuit GDC is arranged in each of the first non-display area NDA1 and the second non-display area NDA2, but the present disclosure is not limited thereto. In another embodiment, the gate driving circuit GDC may be arranged in one of the first non-display area NDA1 and/or the second non-display area NDA2.

The data driving circuit DDC may be arranged in a third non-display area NDA3 and/or a fourth non-display area NDA4, which connect the first non-display area NDA1 and the second non-display area NDA2 to each other. In an embodiment, FIG. 3 illustrates that the data driving circuit DDC is arranged in the fourth non-display area NDA4. In another embodiment, the data driving circuit DDC may be arranged in each of the third non-display area NDA3 and the fourth non-display area NDA4.

FIG. 3 illustrates that the data driving circuit DDC is arranged in the fourth non-display area NDA4 of the display device 1, but the present disclosure is not limited thereto. In another embodiment, the display device 1 may further include a flexible circuit board electrically connected to the display device 1 through a terminal unit (e.g., a terminal or a pad) disposed in the fourth non-display area NDA4, and the data driving circuit DDC may be disposed on the flexible circuit board.

In some embodiments, an elongation rate of the non-display area NDA may be less than or equal to an elongation rate of the display area DA. In an embodiment, the elongation rate of the non-display area NDA may be different by region (e.g., depending on a region). For example, the first non-display area NDA1, the second non-display area NDA2, and the third non-display area NDA3 may have the same or substantially the same elongation rate as each other, but the elongation rate of the fourth non-display area NDA4 may be less than the elongation rate of those of each of the first non-display area NDA1, the second non-display area NDA2, and the third non-display area NDA3.

Figure 4A:
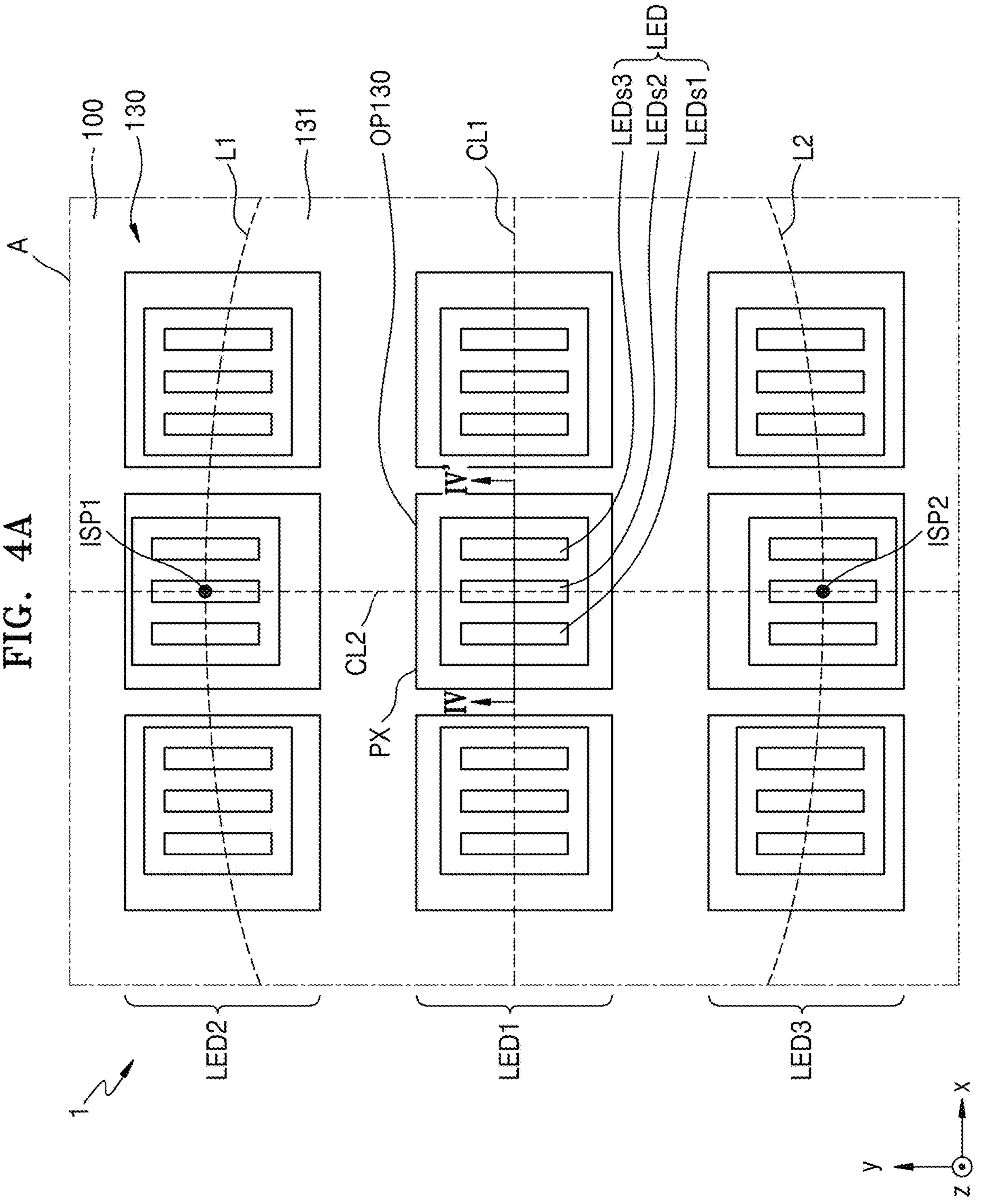
FIG. 4A is a plan view schematically illustrating a display device according to an embodiment.
Figure 4B:
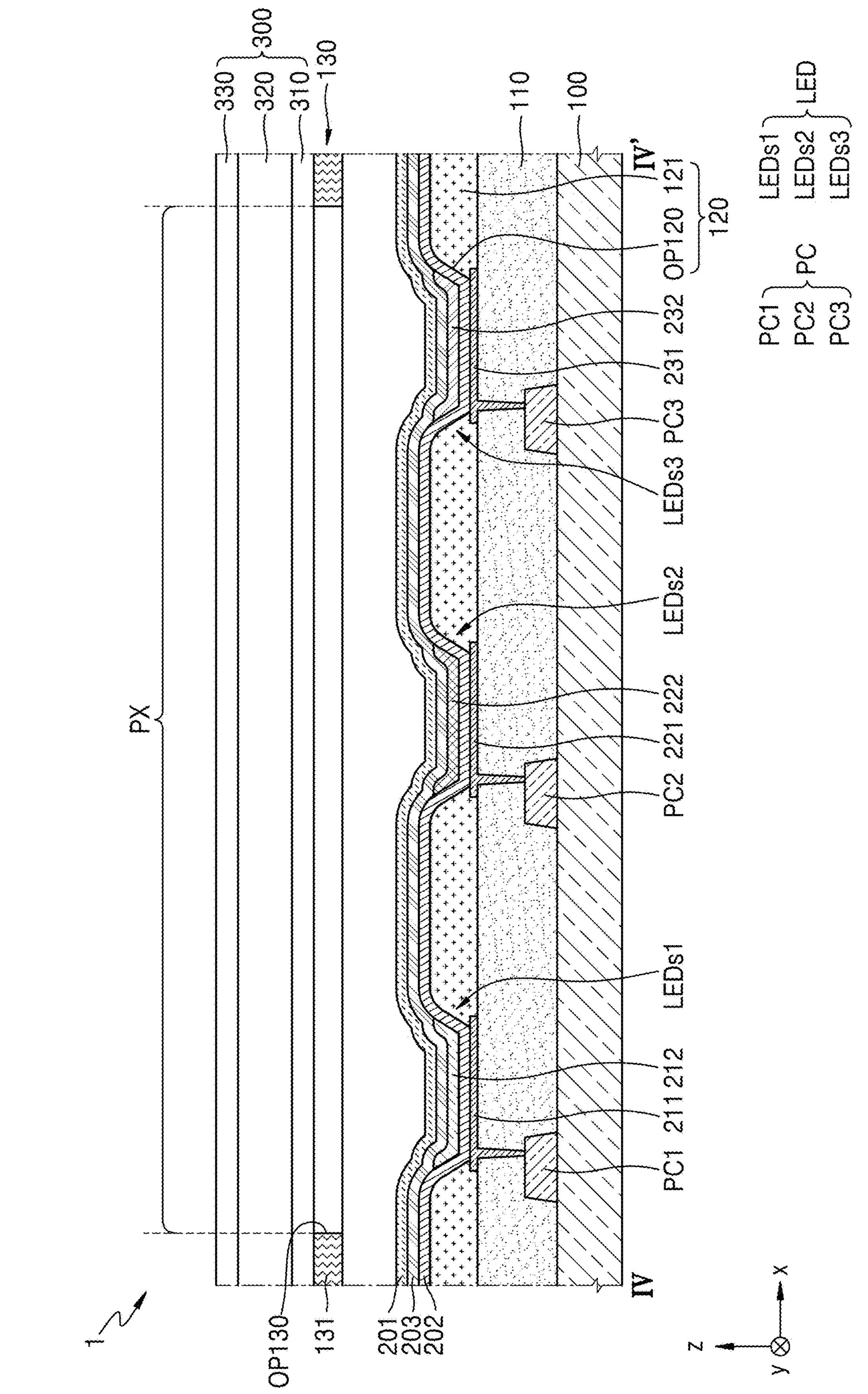
FIG. 4B is a cross-sectional view schematically illustrating a display device according to an embodiment.

FIG. 4A is a plan view schematically illustrating the display device 1 according to an embodiment. FIG. 4B is a cross-sectional view schematically illustrating the display device 1 according to an embodiment.

In more detail, FIG. 4A is an enlarged view of the region A of FIG. 3, and FIG. 4B is a cross-sectional view of the display device 1 taken along the line IV-IV' of FIG. 4A.

Referring to FIGS. 4A and 4B, the display device 1 may include a substrate 100, a circuit element layer 110, a light-emitting element LED, a bank layer 120, a cover layer 130, and an encapsulation layer 300.

The substrate 100 may include a polymer resin, such as polyethersulfone, polyarylate, polyether imide, polyethylene naphthalate, polyethylene terephthalate, polyphenylene sulfide, polyimide, polycarbonate, cellulose triacetate, or cellulose acetate propionate. In an embodiment, the substrate 100 may be a single layer including one of the above-described polymer resin. In another embodiment, the substrate 100 may have a multi-layered structure including a base layer including at least one of the above-described polymer resin, and a barrier layer including an inorganic insulating material. The substrate 100 including the polymer resin may have flexible, rollable, and/or bendable characteristics.

The circuit element layer 110 may be arranged on the substrate 100. The circuit element layer 110 may include a pixel driving circuit portion PC. The pixel driving circuit portion PC may include a thin-film transistor and a storage capacitor. Layers that constitute the thin-film transistor and the storage capacitor, for example, such as a semiconductor layer and electrode layers, may be arranged between insulating layers. The pixel driving circuit portion PC may be provided in a plurality. The plurality of pixel driving circuit portions PC may be arranged to be spaced apart from each other. For example, the pixel driving circuit portion PC may include a first pixel driving circuit portion PC1, a second pixel driving circuit portion PC2, and a third pixel driving circuit portion PC3, which are arranged to be spaced apart from each other.

The bank layer 120 may be disposed on the pixel element layer 110. The bank layer 120 may include an organic material or an inorganic material. When the bank layer 120 includes the organic material, the bank layer 120 may include one or more organic insulating materials selected from the group consisting of polyimide, polyamide, an acryl resin layer, benzocyclobuthene, and a phenol resin layer. When the bank layer 120 includes the inorganic material, the bank layer 120 may have a single layer structure or a multi-layered structure including one or more of silicon oxide (SiOx), silicon nitride (SiNx), and/or silicon oxynitride (SiON).

The light-emitting element LED may be arranged on the circuit element layer 110, and may be electrically connected to the pixel driving circuit portion PC. The light-emitting element LED may include a plurality of sub-light-emitting elements LEDs. For example, the light-emitting element LED may include a first sub-light-emitting element LEDs1, a second sub-light-emitting element LEDs2, and a third sub-light-emitting element LEDs3. The first sub-light-emitting element LEDs1, the second sub-light-emitting element LEDs2, and the third sub-light-emitting element LEDs3 may be arranged to be spaced apart from each other. The first sub-light-emitting element LEDs1 may be electrically connected to the first pixel driving circuit portion PC1. The second sub-light-emitting element LEDs2 may be electrically connected to the second pixel driving circuit portion PC2. The third sub-light-emitting element LEDs3 may be electrically connected to the third pixel driving circuit portion PC3.

The first sub-light-emitting element LEDs1 may include a first pixel electrode 211, a first light-emitting layer 212, a common electrode 201, a first functional layer 202, and a second functional layer 203. The second sub-light-emitting element LEDs2 may include a second pixel electrode 221, a second light-emitting layer 222, the common electrode 201, the first functional layer 202, and the second functional layer 203. The third sub-light-emitting element LEDs3 may include a third pixel electrode 231, a third light-emitting layer 232, the common electrode 201, the first functional layer 202, and the second functional layer 203.

The first through third pixel electrodes 211, 221, and 231 may be arranged on the pixel element layer 110 to be spaced apart from each other. The first through third pixel electrodes 211, 221, and 231 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the first through third pixel electrodes 211, 221, and 231 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a suitable compound thereof. In another embodiment, the first through third pixel electrodes 211, 221, and 231 may further include a layer formed of ITO, IZO, ZnO, or $In_2O_3$ under the above-described reflective layer.

The bank layer 120 may be arranged on the first through third pixel electrodes 211, 221, and 231. The bank layer 120 may include a cover portion 121 and a bank opening OP120. The cover portion 121 may cover an end of each of the first through third pixel electrodes 211, 221, and 231. Also, the bank opening OP120 may expose a part of each of the first through third pixel electrodes 211, 221, and 231.

The first light-emitting layer 212 may be arranged on the first pixel electrode 211, the second light-emitting layer 222 may be arranged on the second pixel electrode 221, and the third light-emitting layer 232 may be arranged on the third pixel electrode 231. The first through third light-emitting layers 212, 222, and 232 may be accommodated in the bank opening OP120 of the bank layer 120. The first through third light-emitting layers 212, 222, and 232 may include a polymer or a low-molecular weight organic material that emits light of a desired color (e.g., a certain or predetermined color). As another example, the first through third light-emitting layers 212, 222, and 232 may include an inorganic light-emitting material or a quantum dot. The first through third light-emitting layers 212, 222, and 232 may emit light of different colors from each other. For example, the first light-emitting layer 212 may emit red light, the second light-emitting layer 222 may emit green light, and the third light-emitting layer 232 may emit blue light.

The common electrode 201 may be arranged on the first through third light-emitting layers 212, 222, and 232. The common electrode 201 may cover the bank layer 120. The common electrode 201 may include a conductive material having a low work function. For example, the common electrode 201 may include a (semi-) transparent layer including Ag, Mg, Al, Pt, Pd, Au, Ni, Nd, Ir, Cr, lithium (Li), calcium (Ca), or a suitable alloy thereof. As another example, the common electrode 201 may further include a layer, such as ITO, IZO, ZnO, or $In_2O_3$, on the (semi-) transparent layer including one or more of the above-described materials.

The first functional layer 202 may be arranged to be disposed between the first through third light-emitting layers 212, 222, and 232 and the first through third pixel electrodes 211, 221, and 231, or may be arranged on the bank layer 120. For example, the first functional layer 202 may include, for example, a hole transport layer (HTL), or an HTL and a hole injection layer (HIL).

The second functional layer 203 may be arranged to be disposed between the first through third light-emitting layers 212, 222, and 232 and the common electrode 201. For example, the second functional layer 203 may include an electron transport layer (ETL) and/or an electron injection layer (EIL).

The first functional layer 202, the second functional layer 203, and the common electrode 201 may be sequentially stacked on the cover portion 121 of the bank layer 120. The first functional layer 202, the second functional layer 203, and the common electrode 201 may be common layers formed to entirely or substantially entirely cover the substrate 100.

The cover layer 130 may be arranged on the substrate 100. The cover layer 130 may be arranged on the common electrode 201 of the light-emitting element LED. The cover layer 130 may include a cover frame 131, a support portion (e.g., see 132 of FIG. 5A), and a cover opening OP130.

The support portion 132 will be described in more detail below with reference to FIGS. 5A and 5B.

The cover frame 131 may be arranged on the substrate 100 to be spaced apart from the common electrode 201. The cover frame 131 may include an opaque material. For example, the cover frame 131 may include at least one of a thermoplastic polyurethane (TPU), a thermoplastic polyethylene (TPE), and/or a silicon rubber.

The cover opening OP130 may be arranged on the cover frame 131. The cover opening OP130 may pass through (e.g., may penetrate) the cover frame 131. The cover opening OP130 may overlap with the light-emitting element LED. For example, one cover opening OP130 may overlap with the first sub-light-emitting element LEDs1, the second sub-light-emitting element LEDs2, and the third sub-light-emitting element LEDs3. The light-emitting element LED may be exposed to the outside from the cover frame 131 through the cover opening OP130. Light emitted from the light-emitting element LED may be displayed to the outside through the cover opening OP130. Thus, the light-emitting element LED may be defined as a pixel PX.

The encapsulation layer 300 may be disposed on the substrate 100. The encapsulation layer 300 may be disposed on the cover layer 130. The encapsulation layer 300 may be supported by the cover layer 130. The encapsulation layer 300 may include at least one inorganic encapsulation layer and at least one organic encapsulation layer. In an example, the encapsulation layer 300 may include a first inorganic encapsulation layer 310, an organic encapsulation layer 320, and a second inorganic encapsulation layer 330, which are sequentially stacked. However, the present disclosure is not limited thereto, and the encapsulation layer 300 may have various suitable configurations as needed or desired.

The first inorganic encapsulation layer 310 and the second inorganic encapsulation layer 330 may include one or more materials selected from the group consisting of silicon nitride, aluminum nitride, zirconium nitride, titanium nitride, hafnium nitride, tantalum nitride, silicon oxide, aluminum oxide, titanium oxide, zinc oxide, cerium oxide, and silicon oxynitride.

The organic encapsulation layer 320 may include one or more materials selected from the group consisting of an acryl-based resin layer, a methacrylate resin layer, polyisoprene, a vinyl-based resin layer, an epoxy-based resin layer, a urethane-based resin layer, a cellulose-based resin layer, and a perylene-based resin layer.

FIG. 4B illustrates an embodiment in which the encapsulation layer 300 is formed on the plurality of light-emitting elements LED, but the present disclosure is not limited thereto. In other words, the display device 1 may include a sealing substrate instead of the encapsulation layer 300. The sealing substrate may be combined with (e.g., may be coupled with or attached with) the substrate 100 by using a sealing member, such as sealing glass frit, and may block external moisture, air, and/or the like.

In some embodiments, various functional layers, such as a polarization layer, a color filter layer, a touch screen layer, and/or the like, may be further arranged on the encapsulation layer 300.

Referring to FIGS. 3 and 4A, a first structure of the display device 1 may be illustrated. The first structure of the display device 1 may be a structure before the display device 1 is elongated (e.g., is stretched).

For convenience of illustration, a virtual center line passing through the center of the display area DA in the first direction (e.g., the x direction and/or the −x direction) may be referred to as a first center line CL1, and a virtual center line passing through the center of the display area DA in the second direction (e.g., the y direction and/or the −y direction) may be referred to as a second center line CL2. The second direction (e.g., the y direction and/or the −y direction) may be a direction crossing the first direction (e.g., the x direction and/or the −x direction). For example, an angle between the first direction (e.g., the x direction and/or the −x direction) and the second direction (e.g., the y direction and/or the −y direction) may be a right or substantially right angle.

In the first structure, a virtual line that is spaced apart from the first center line CL1 in the second direction (e.g., the y direction), and convex in the second direction (e.g., the y direction), may be referred to as a first line L1. In the first structure, a distance between the first center line CL1 and the first line L1 may be gradually decreased along the first direction (e.g., the x direction and/or the −x direction) based on the second center line CL2. In other words, in the first structure, a distance between an intersection or crossing between the first center line CL1 and the second center line CL2 and an intersection or crossing ISP1 between the first line L1 and the second center line CL2 may be the greatest from among the distances between the first center line CL1 and the first line L1.

Also, in the first structure, a virtual line that is symmetrical or substantially symmetrical with respect to the first line L1 based on the first center line CL1 may be referred to as a second line L2. In other words, in the first structure, the second line L2 may be a virtual line that is spaced apart from the first center line CL1 in the second direction (e.g., the −y direction), and convex in the second direction (e.g., the −y direction). In the first structure, a distance between the first center line CL1 and the second line L2 may decrease gradually along the first direction (e.g., the x direction and/or the −x direction) based on the second center line CL2. In other words, in the first structure, a distance between an intersection or crossing between the first center line CL1 and the second centerline CL2 and an intersection or crossing ISP2 between the second line L2 and the second center line CL2 may be the greatest from among the distances between the first center line CL1 and the second line L2.

The light-emitting element LED may be provided in a plurality. In the first structure, the plurality of light-emitting elements LED may be arranged at different intervals. The plurality of light-emitting elements LED may be arranged symmetrically or substantially symmetrically based on the first center line CL1 and the second center line CL2.

For example, the plurality of light-emitting elements LED may include a plurality of first light-emitting elements LED1, a plurality of second light-emitting elements LED2, and a plurality of third light-emitting elements LED3. The plurality of first light-emitting elements LED1 may be linearly arranged along the first center line CL1. The plurality of second light-emitting elements LED2 may be linearly arranged along the first line L1. The plurality of third light-emitting elements LED3 may be linearly arranged along the second line L2.

At least one of the plurality of first light-emitting elements LED1, at least one of the plurality of second light-emitting elements LED2, and at least one of the plurality of third light-emitting elements LED3 may be linearly arranged along the second direction (e.g., the y direction and/or the −y direction). The plurality of first light-emitting elements LED1 may be arranged in a straight line form along the first direction (e.g., the x direction and/or the −x direction). The plurality of second light-emitting elements LED2 and the plurality of third light-emitting elements LED3 may be arranged in a convex curved form based on the first center line CL1. In other words, the plurality of light-emitting elements LED may be arranged in a radial form.

The cover frame 131 of the cover layer 130 may be arranged on the light-emitting element LED. The cover opening OP130 of the cover layer 130 may be provided in a plurality. The plurality of cover openings OP130 may overlap with the plurality of light-emitting elements LED. The number of cover openings OP130 may be the same as the number of light-emitting elements LED, and one cover opening OP130 may correspond to one light-emitting element LED.

In a plan view, a size of each of the plurality of cover openings OP130 may be greater than a size of each of the plurality of light-emitting elements LED. In a plan view, the size of one of the plurality of cover openings OP130 may be greater than a sum of the sizes of the first sub-light-emitting element LEDs1, the second sub-light-emitting element LEDs2, and the third sub-light-emitting element LEDs3 of one light-emitting element LED. In other words, in a plan view, the cover frame 131 and the plurality of light-emitting elements LED may not overlap with each other.

The plurality of cover openings OP130 may be arranged at equal or substantially equal intervals. The plurality of cover openings OP130 may be arranged in a lattice form along the first direction (e.g., the x direction and/or the −x direction) and the second direction (e.g., the y direction and/or the −y direction). The plurality of light-emitting elements LEDs may be arranged symmetrically or substantially symmetrically based on the first center line CL1 and the second center line CL2. A distance between the plurality of cover openings OP130 that are linearly arranged along the first direction (e.g., the x direction and/or the −x direction) may be the same. Also, a distance between the plurality of cover openings OP130 that are linearly arranged along the second direction (e.g., the y direction and/or the −y direction) may be the same.

In the above-described structure, the cover opening OP130 is defined as (or defines) a pixel PX. Thus, even when the plurality of light-emitting elements LED are arranged at different intervals, the plurality of pixels PX may be arranged at equal or substantially equal intervals. In other words, even when the plurality of light-emitting elements LED are arranged in a radial form, the plurality of pixels PX may be uniformly or substantially uniformly arranged in a lattice form.

Figure 5A:
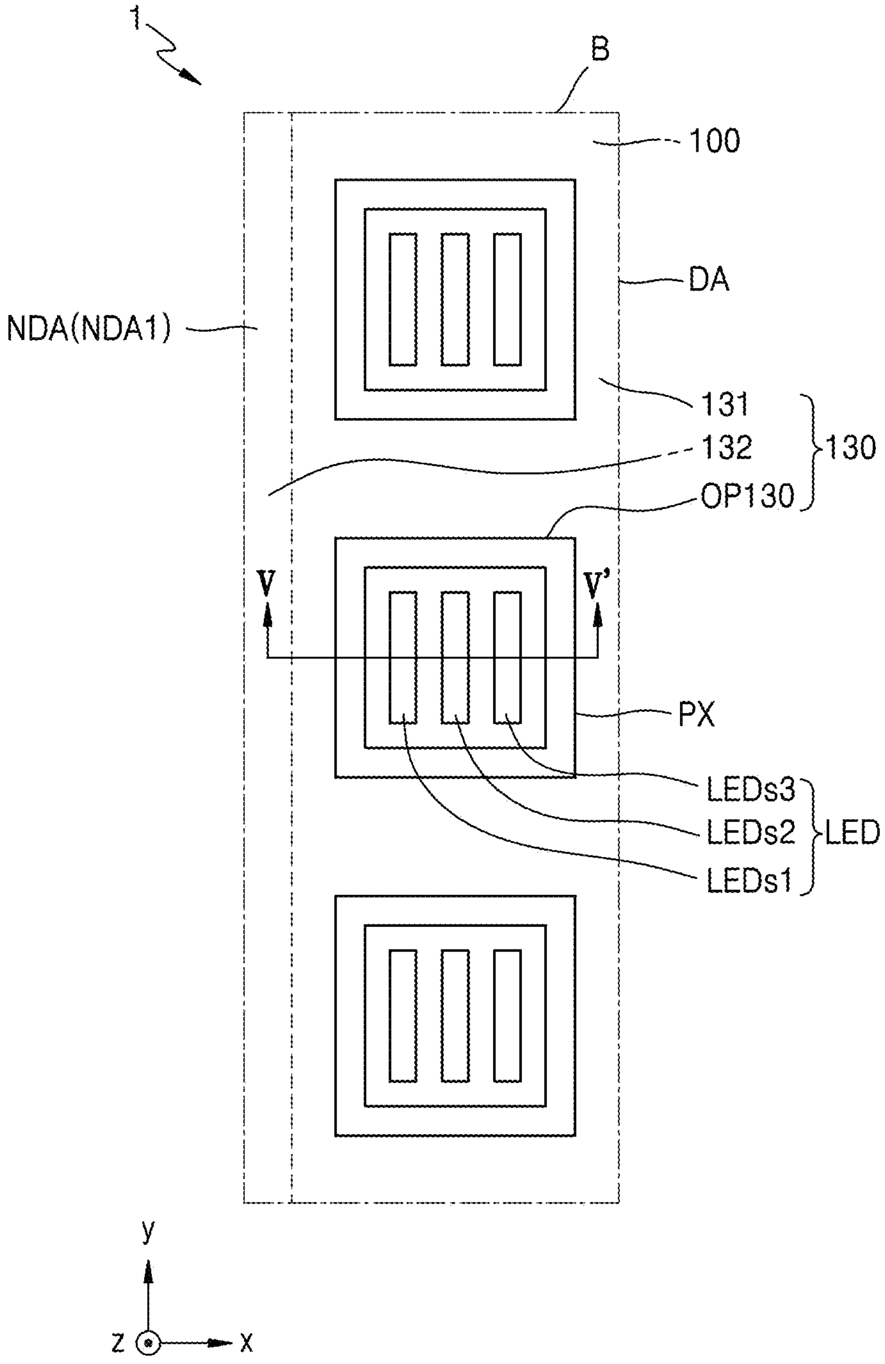
FIG. 5A is a plan view schematically illustrating a display device according to an embodiment.

FIG. 5A is a plan view schematically illustrating the display device 1 according to an embodiment. FIG. 5B is a cross-sectional view schematically illustrating the display device 1 according to an embodiment.

Figure 5B:
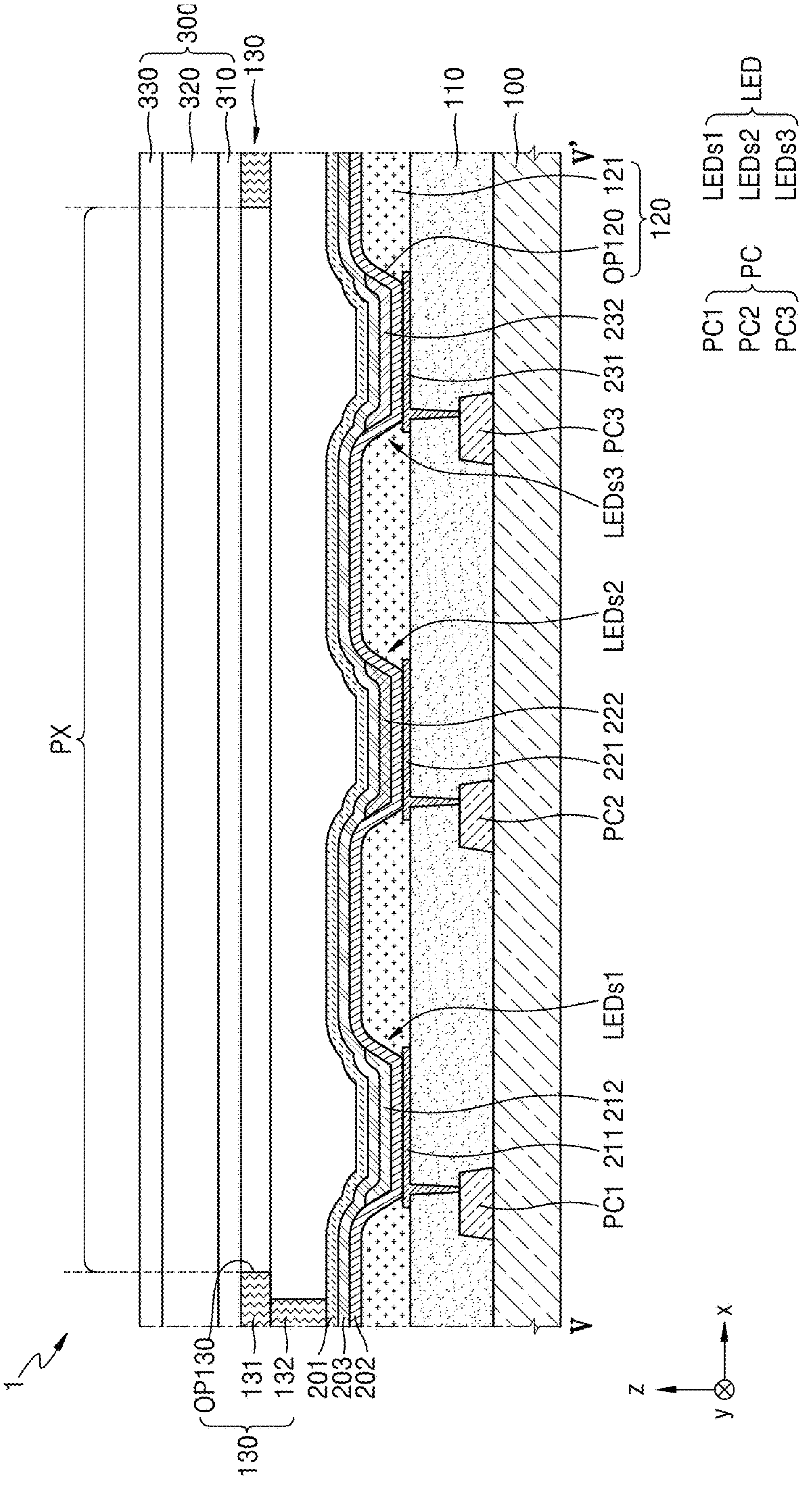
FIG. 5B is a cross-sectional view schematically illustrating a display device according to an embodiment.

In more detail, FIG. 5A is an enlarged view of the region B of FIG. 3, and FIG. 5B is a cross-sectional view of the display device 1 taken along the line V-V' of FIG. 5A.

In FIGS. 5A and 5B, the same reference numerals as those described above with reference to FIGS. 4A and 4B are used to represent the same or substantially the same elements, and thus, redundant description thereof may not be repeated.

Referring to FIGS. 5A and 5B, the display device 1 may include a substrate 100, a circuit element layer 110, a light-emitting element LED, a bank layer 120, a cover layer 130, and an encapsulation layer 300.

The substrate 100 may be flexible, rollable, or bendable. The circuit element layer 110 may be arranged on the substrate 100. The circuit element layer 110 may include a pixel driving circuit portion PC. For example, the pixel driving circuit portion PC may include a first pixel driving circuit portion PC1, a second pixel driving circuit portion PC2, and a third pixel driving circuit portion PC3, which are arranged to be spaced apart from each other. A bank layer 120 may be disposed on the pixel element layer 110.

The light-emitting element LED may be arranged on the circuit element layer 110, and may be electrically connected to the pixel driving circuit portion PC. The light-emitting element LED may include a plurality of sub-light-emitting elements LEDs. For example, the light-emitting element LED may include a first sub-light-emitting element LEDs1, a second sub-light-emitting element LEDs2, and a third sub-light-emitting element LEDs3.

The first sub-light-emitting element LEDs1 may include a first pixel electrode 211, a first light-emitting layer 212, a common electrode 201, a first functional layer 202, and a second functional layer 203. The second sub-light-emitting element LEDs2 may include a second pixel electrode 221, a second light-emitting layer 222, the common electrode 201, the first functional layer 202, and the second functional layer 203. The third sub-light-emitting element LEDs3 may include a third pixel electrode 231, a third light-emitting layer 232, the common electrode 201, the first functional layer 202, and the second functional layer 203. The bank layer 120 may be arranged on the first through third pixel electrodes 211, 221, and 231. The bank layer 120 may include a cover portion 121 and a bank opening OP120.

The cover layer 130 may be arranged on the substrate 100. The cover layer 130 may be arranged on the common electrode 201 of the light-emitting element LED. The cover layer 130 may include the cover frame 131 and the cover opening OP130.

The cover frame 131 may be arranged on the substrate 100 to be spaced apart from the common electrode 201. The cover frame 131 may include an opaque material. For example, the cover frame 131 may include at least one of TPU, TPE, and/or a silicon rubber.

The support portion 132 may support the cover frame 131 from the substrate 100. For example, at least a part of the support portion 132 may be arranged in the non-display area (e.g., see NDA of FIG. 3), and may support the cover frame 131. One side of the support portion 132 may be fixed to the common electrode 201, and another side (e.g., an opposite side) of the support portion 132 may be fixed to the cover frame 131. The support portion 132 may include the same material as that of the cover frame 131. For example, the support portion 132 may include at least one of TPU, TPE, and/or a silicon rubber. The support portion 132 and the cover frame 132 may be formed together as a single body.

The cover opening OP130 may be arranged at (e.g., in or on) the cover frame 131. The cover opening OP130 may pass through (e.g., may penetrate) the cover frame 131. The cover opening OP130 may overlap with the light-emitting element LED. For example, one cover opening OP130 may overlap with all of the first sub-light-emitting element LEDs1, the second sub-light-emitting element LEDs2, and the third sub-light-emitting element LEDs3 of one light-emitting element LED. The light-emitting element LED may be exposed to the outside from the cover frame 131 through the cover opening OP130. Light emitted from the light-emitting element LED may be displayed to the outside through the cover opening OP130. Thus, the light-emitting element LED may be defined as a pixel PX.

The encapsulation layer 300 may be disposed on the substrate 100. The encapsulation layer 300 may be disposed on the cover layer 130. The encapsulation layer 300 may be supported by the cover layer 130. The encapsulation layer 300 may include at least one inorganic encapsulation layer and at least one organic encapsulation layer. In an example, the encapsulation layer 300 may include a first inorganic encapsulation layer 310, an organic encapsulation layer 320, and a second inorganic encapsulation layer 330, which are sequentially stacked. However, the present disclosure is not limited thereto, and the encapsulation layer 300 may have various suitable configurations.

Figure 6:
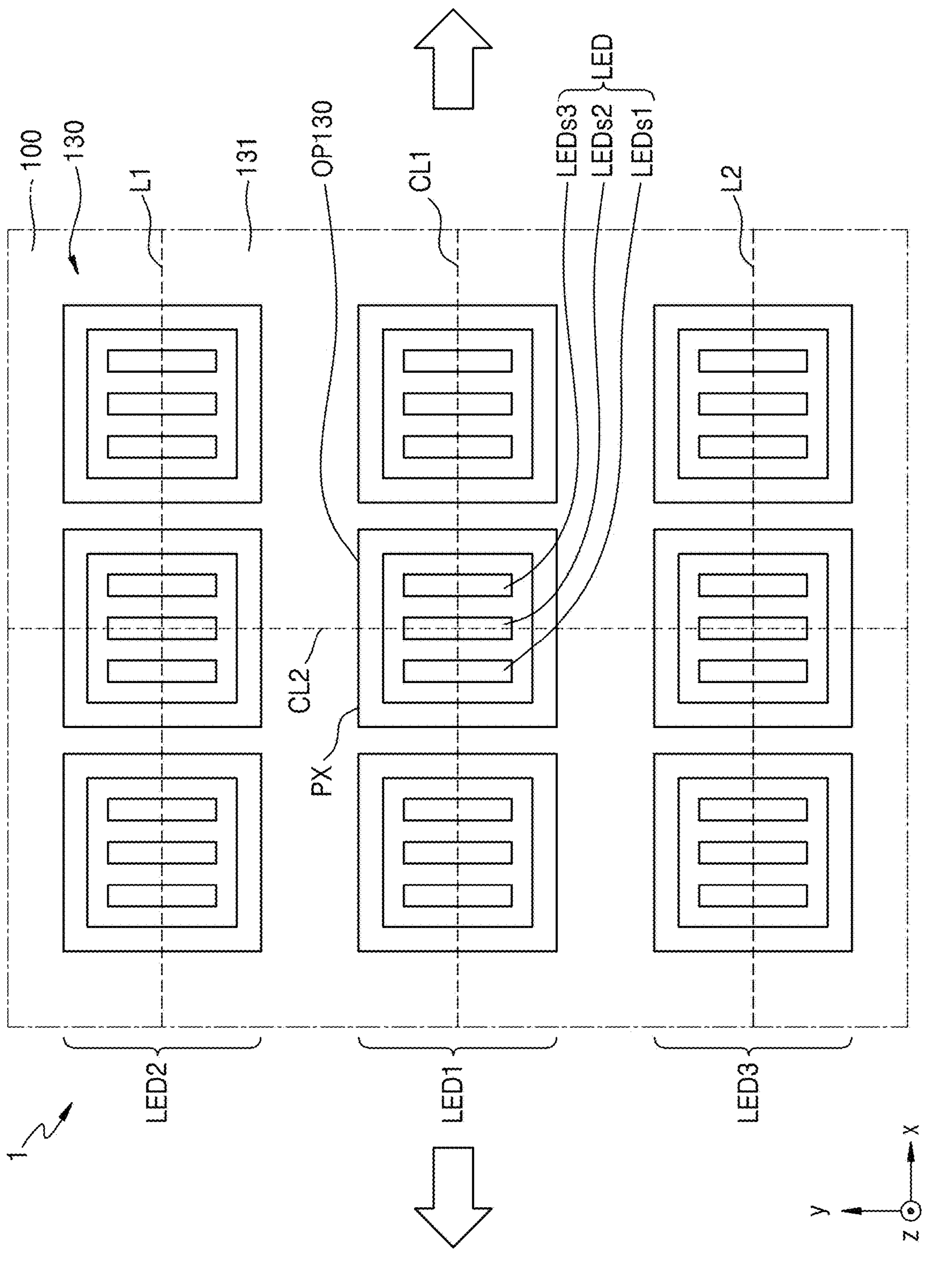
FIG. 6 is a plan view schematically illustrating a display device according to an embodiment.

FIG. 6 is a plan view schematically illustrating the display device 1 according to an embodiment.

In more detail, FIG. 6 is an enlarged view of the region A of FIG. 3. In FIG. 6, the same reference numerals as those described above with reference to FIG. 4A are used to represent the same or substantially the same elements, and thus, redundant description thereof may not be repeated.

Referring to FIGS. 3 and 6, a second structure of the display device 1 may be illustrated. The second structure of the display device 1 may be a structure in which the display device 1 is elongated (e.g., stretched) from the first structure of the display device 1 in the first direction (e.g., the x direction and/or the −x direction). In other words, the display device 1 may be converted between the first structure shown in FIG. 4A and the second structure shown in FIG. 6.

An elongation rate of the substrate 100 may be diversified according to a position. The elongation rate of the substrate 100 in the first direction (e.g., the x direction and/or the −x direction) may be increased toward the first direction (e.g., the x direction and/or the −x direction) from the second center line CL2. In other words, the elongation rate of the substrate 100 from the second center line CL2 in the first direction (e.g., the x direction and/or the −x direction) may be the smallest.

As the substrate 100 is elongated in the first direction (e.g., the x direction and/or the −x direction), the substrate 100 may be contracted in the second direction (e.g., the y direction and/or the −y direction) toward the first center line CL1. In the second structure, a gap (e.g., a distance) between the first center line CL1 and the first line L1 may be reduced in comparison with that of the first structure. Also, in the second structure, a gap (e.g., a distance) between the first center line CL1 and the second line L2 may be reduced in comparison with that of the first structure. In this case, a degree at which the substrate 100 is contracted in a direction toward the first center line CL1 may decrease away from the second center line CL2 in the first direction (e.g., the x direction and/or the −x direction). In other words, in the second center line CL2, the elongation rate of the substrate 100 in the direction toward the first center line CL1 may be the greatest.

In the second structure, as the display device 1 is elongated in the first direction (e.g., the x direction and/or the −x direction), a distance between the plurality of light-emitting elements LED in the first direction (e.g., the x direction and/or the −x direction) may increase. Also, in the second structure, as the display device 1 is elongated in the first direction (e.g., the x direction and/or the −x direction), a distance between the plurality of light-emitting elements LED in the first direction (e.g., the x direction and/or the −x direction) may decrease. In more detail, in the second structure, as the display device 1 is elongated in the first direction (e.g., the x direction and/or the −x direction), a distance between the plurality of light-emitting elements LED adjacent to the second center line CL2 may decrease greatly.

Thus, in the second structure, a curvature of each of the first line CL1 and the second line L2 may be reduced in comparison with those of the first structure. For example, in the second structure, the curvature of each of the first line L1 and the second line L2 may be 0. In this case, in the second structure, the first line L1 and the second line L2 may be straight or substantially straight lines. In the second structure, the distance between the plurality of light-emitting elements LED may be uniform or substantially uniform in comparison with that of the first structure. In the second structure, when the curvatures of the first line L1 and the second line L2 are 0, the plurality of light-emitting elements LED may be arranged in a lattice form in the first direction (e.g., the x direction and/or the −x direction) and the second direction (e.g., the y direction and/or the −y direction).

A modulus of the cover frame 131 may be less than a modulus of the substrate 100. Thus, the elongation rate of the cover frame 131 according to a position may be uniform or substantially uniform in comparison with that of the substrate 100.

As the cover frame 131 is elongated in the first direction (e.g., the x direction and/or the −x direction), the cover frame 131 may be contracted in the direction toward the first center line CL1. In this case, a degree at which the cover frame 131 is contracted in the direction toward the first center line CL1 may be uniform or substantially uniform in comparison with that of the substrate 100.

In the second structure, as the display device 1 is elongated in the first direction (e.g., the x direction and/or the −x direction), a distance between a plurality of cover openings OP130 in the first direction (e.g., the x direction and/or the −x direction) may increase. Also, in the second structure, as the display device 1 is elongated in the first direction (e.g., the x direction and/or the −x direction), a distance between the plurality of cover openings OP130 in the second direction (e.g., the y direction and/or the −y direction) may decrease.

However, even when the first structure is converted into the second structure, the distance between the plurality of cover openings OP130 may be continuously uniform or substantially uniform. In other words, in each of the first structure and the second structure, the plurality of cover openings OP130 may be arranged in a lattice form in the first direction (e.g., the x direction and/or the −x direction) and the second direction (e.g., the y direction and/or the −y direction). In the second structure, the plurality of cover openings OP130 are arranged at equal or substantially equal intervals. Thus, the plurality of pixels PX may also be arranged at equal or substantially equal intervals. In other words, in the second structure, the plurality of pixels PX may be uniformly or substantially uniformly arranged in a lattice form.

Referring to FIGS. 4A and 6, in each of the first structure and the second structure, the plurality of pixels PX may be uniformly or substantially uniformly arranged at equal or substantially equal intervals. In other words, even when the display device 1 is elongated in the first direction (e.g., the x direction and/or the −x direction), and a deformation occurs in the arrangement of the plurality of light-emitting elements LED, the cover layer 130 may compensate for the deformation of the arrangement of the plurality of light-emitting elements LED.

Also, as in the first structure, the plurality of light-emitting elements LED are arranged in a radial form, even when a distance between the first center line CL1, the first line L1, and the second line L2 decreases in the second structure. As such, a desired minimum distance between the plurality of light-emitting elements LED may be secured. As the substrate 100 is contracted in the second direction (e.g., the y direction and/or the −y direction), a phenomenon in which a distance between the plurality of light-emitting elements LED in the second direction (e.g., the y direction and/or the −y direction) decreases greatly may be prevented or reduced. Thus, a stress generated in the substrate 100 and the plurality of light-emitting elements LED may be reduced, and the durability of the display device 1 may be enhanced.

Figure 7A:
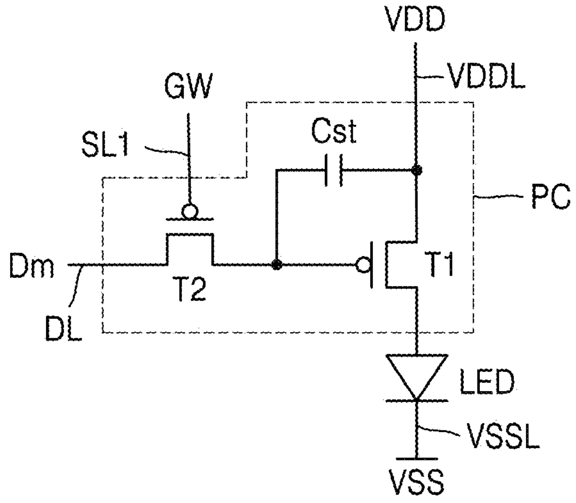
FIGS. 7A-7C are equivalent circuit diagrams of sub-pixels of a display device according to one or more embodiments.
Figure 7B:
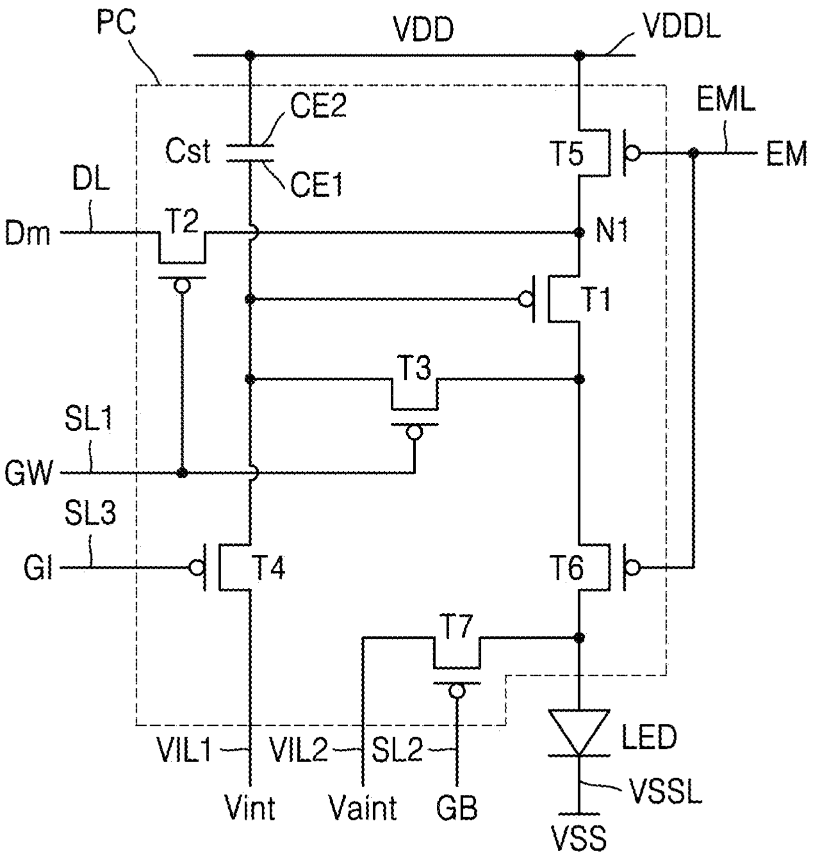
Figure 7C:
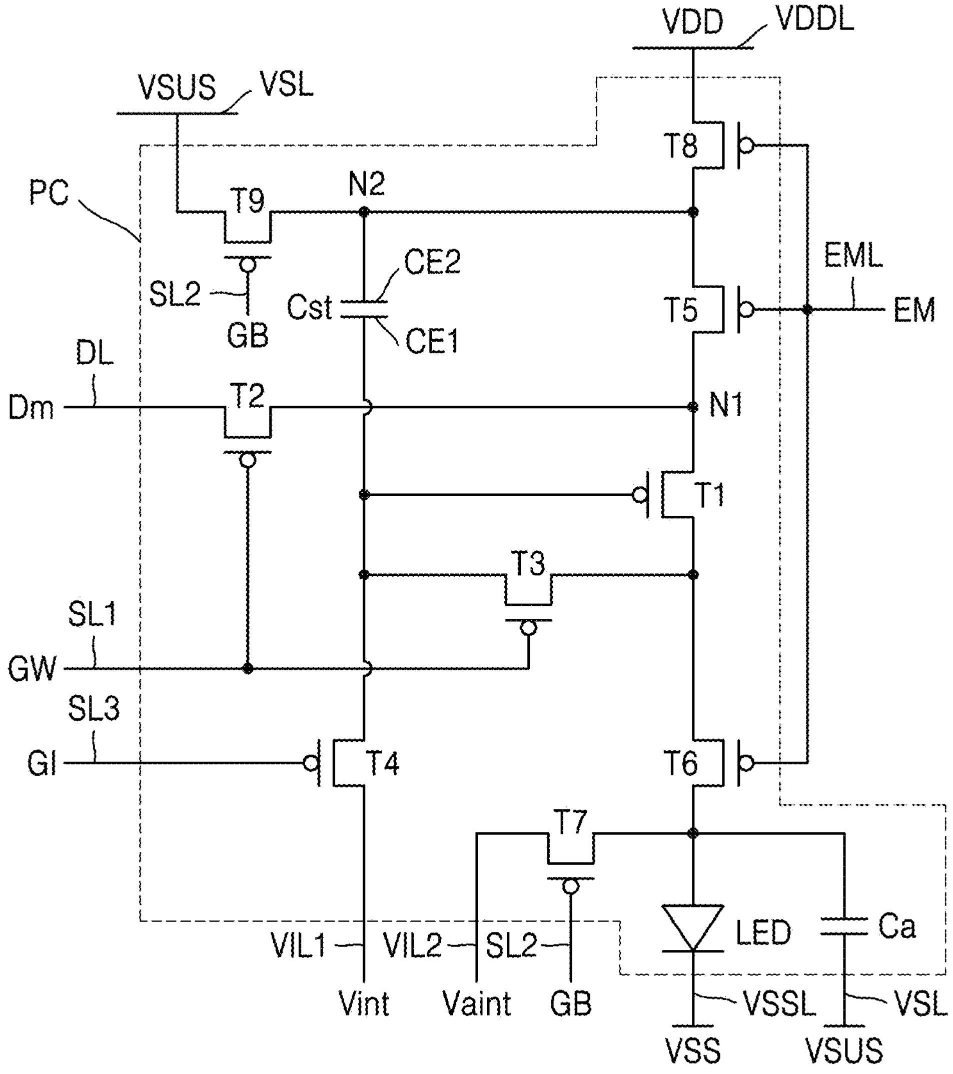

FIGS. 7A through 7C are equivalent circuit diagrams of sub-pixels of the display device 1 according to one or more embodiments.

Referring to FIG. 7A, a light-emitting element LED corresponding to a sub-pixel may be electrically connected to a pixel driving circuit portion PC. The pixel driving circuit portion PC may include a first transistor T1, a second transistor T2, and a storage capacitor Cst. The pixel driving circuit portion PC may be electrically connected to signal lines and a voltage line. The signal lines may include a gate line, such as a first scan line SL1, and a data line DL. The voltage line may include a first voltage line VDDL.

The second transistor T2 may be electrically connected to the first scan line SL1 and the data line DL. The first scan line SL1 may provide a first scan signal GW to a gate electrode of the second transistor T2. The second transistor T2 may transmit a data signal Dm input from the data line DL to the first transistor T1 in response to the first scan signal GW input from the first scan line SL1.

The storage capacitor Cst may be connected to the second transistor T2 and the first voltage line VDDL, and may store a voltage corresponding to a difference between a voltage transmitted from the second transistor T2 and a first power supply voltage VDD supplied by the first voltage line VDDL.

The first transistor T1 may be a driving transistor, and may control a driving current flowing through the light-emitting element LED. The first transistor T1 may be connected to the first voltage line VDDL and the storage capacitor Cst. The first transistor T1 may control the driving current flowing through the light-emitting element LED from the first voltage line VDDL, in response to a value of the voltage stored in the storage capacitor Cst. The light-emitting element LED may emit light having a desired luminance (e.g., a certain or predetermined luminance) by using the driving current. A first electrode of the light-emitting element LED may be electrically connected to the first transistor T1, and a second electrode of the light-emitting element LED may be electrically connected to a second voltage line VSSL for supplying a second power supply voltage VSS.

FIG. 7A illustrates that the pixel driving circuit portion PC includes two transistors and one storage capacitor. However, in another embodiment, the pixel driving circuit portion PC may include three or more transistors.

Referring to FIG. 7B, the pixel driving circuit portion PC may include a first transistor T1, a second transistor T2, a third transistor T3, a fourth transistor T4, a fifth transistor T5, a sixth transistor T6, a seventh transistor T7, and a storage capacitor Cst.

The pixel driving circuit portion PC may be electrically connected to signal lines and voltage lines. The signal lines may include a gate line, such as a first scan line SL1, a second scan line SL2, a third scan line SL3, and an emission control line EML, and a data line DL. The voltage lines may include first and second initialization voltage lines VIL1 and VIL2, and a first voltage line VDDL.

The first voltage line VDDL may transmit the first power supply voltage VDD to the first transistor T1. The first initialization voltage line VIL1 may transmit a first initialization voltage Vint for initializing the first transistor T1 to the pixel driving circuit portion PC. The second initialization voltage line VIL2 may transmit a second initialization voltage Vaint for initializing the first electrode of the light-emitting element LED to the pixel driving circuit portion PC.

The first transistor T1 may be electrically connected to the first voltage line VDDL via the fifth transistor T5, and may be electrically connected to the light-emitting element LED via the sixth transistor T6. The first transistor T1 may serve as a driving transistor, may receive the data signal Dm according to a switching operation of the second transistor T2, and may supply a driving current to the light-emitting element LED.

The second transistor T2 may be a data writing transistor, and may be electrically connected to the first scan line SL1 and the data line DL. The second transistor T2 may be electrically connected to the first voltage line VDDL via the fifth transistor T5. The second transistor T2 may be turned on in response to the first scan signal GW transmitted through the first scan line SL1, and may perform a switching operation of transmitting the data signal Dm, which is transmitted from the data line DL, to a first node N1.

The third transistor T3 may be electrically connected to the first scan line SL1, and may be electrically connected to the light-emitting element LED via the sixth transistor T6. The third transistor T3 may be turned on in response to the first scan signal GW transmitted through the first scan line SL1, and may diode-connect the first transistor T1.

The fourth transistor T4 may be a first initialization transistor, and may be electrically connected to the third scan line SL3 and the first initialization voltage line VIL1. The fourth transistor T4 may be turned on in response to a third scan signal GI transmitted through the third scan line SL3, and may transmit the first initialization voltage Vint from the first initialization voltage line VIL1 to the gate electrode of the first transistor T1, thereby initializing a voltage of the gate electrode of the first transistor T1. The third scan signal GI may correspond to a first scan signal of another pixel driving circuit portion disposed in the previous row of the pixel driving circuit portion PC.

The fifth transistor T5 may be an operation control transistor, and the sixth transistor T6 may be an emission control transistor. The fifth transistor T5 and the sixth transistor T6 may be electrically connected to the emission control line EML, may be turned on concurrently or substantially simultaneously with each other in response to the emission control signal EM transmitted through the emission control line EML, and may form a current path through which a driving current may flow in a direction from the first voltage line VDDL to the light-emitting element LED.

The seventh transistor T7 may be a second initialization transistor, and may be electrically connected to the second scan line SL2, the second initialization voltage line VIL2, and the sixth transistor T6. The seventh transistor T7 may be turned on in response to a second scan signal GB transmitted through the second scan line SL2, and may transmit the second initialization voltage Vaint from the second initialization voltage line VIL2 to the first electrode of the light-emitting element LED, thereby initializing the first electrode of the light-emitting element LED.

The storage capacitor Cst may include a first electrode CE1 and a second electrode CE2. The first electrode CE1 may be electrically connected to the gate electrode of the first transistor T1, and the second electrode CE2 may be electrically connected to the first voltage line VDDL. The storage capacitor Cst may store and maintain a voltage corresponding to a voltage difference between the first voltage line VDDL and the gate electrode of the first transistor T1, thereby maintaining or substantially maintaining a voltage applied to the gate electrode of the first transistor T1.

Referring to FIG. 7C, the pixel driving circuit portion PC may include the first transistor T1, the second transistor T2, the third transistor T3, the fourth transistor T4, the fifth transistor T5, the sixth transistor T6, the seventh transistor T7, an eighth transistor T8, a ninth transistor T9, the storage capacitor Cst, and an auxiliary capacitor Ca.

The pixel driving circuit portion PC may be electrically connected to signal lines and voltage lines. The signal lines may include a gate line, such as a first scan line SL1, a second scan line SL2, a third scan line SL3, and an emission control line EML, and a data line DL. The voltage lines may include first and second initialization voltage lines VIL1 and VIL2, a maintenance voltage line VSL, and a first voltage line VDDL.

The first voltage line VDDL may transmit the first power supply voltage VDD to the first transistor T1. The first initialization voltage line VIL1 may transmit the first initialization voltage Vint for initializing the first transistor T1 to the pixel driving circuit portion PC. The second initialization voltage line VIL2 may transmit the second initialization voltage Vaint for initializing the first electrode of the light-emitting element LED to the pixel driving circuit portion PC. The maintenance voltage line VSL may provide a maintenance voltage VSUS to a second node N2 (e.g., the second capacitor electrode CE2 of the storage capacitor Cst) in an initialization section and a data writing section.

The first transistor T1 may be electrically connected to the first voltage line VDDL via the fifth transistor T5 and the eighth transistor T8, and may be electrically connected to the light-emitting element LED via the sixth transistor T6. The first transistor T1 may serve as a driving transistor, may receive the data signal Dm according to a switching operation of the second transistor T2, and may supply a driving current to the light-emitting element LED.

The second transistor T2 may be electrically connected to the first scan line SL1 and the data line DL, and may be electrically connected to the first voltage line VDDL via the fifth transistor T5 and the eighth transistor T8. The second transistor T2 may be turned on in response to the first scan signal GW transmitted through the first scan line SL1, and may perform a switching operation of transmitting the data signal Dm, which is transmitted from the data line DL, to the first node N1.

The third transistor T3 may be electrically connected to the first scan line SL1, and may be electrically connected to the light-emitting element LED via the sixth transistor T6. The third transistor T3 may be turned on in response to the first scan signal GW transmitted through the first scan line SL1, and may diode-connect the first transistor T1, thereby compensating for a threshold voltage of the first transistor T1.

The fourth transistor T4 may be electrically connected to the third scan line SL3 and the first initialization voltage line VIL1, may be turned on in response to the third scan signal GI transmitted through the third scan line SL3, and may transmit the first initialization voltage Vint from the first initialization voltage line VIL1 to the gate electrode of the first transistor T1, thereby initializing the voltage of the gate electrode of the first transistor T1. The third scan signal GI may correspond to a first scan signal of another pixel driving circuit portion disposed in the previous row of the pixel driving circuit portion PC.

The fifth transistor T5, the sixth transistor T6, and the eighth transistor T8 may be electrically connected to the emission control line EML, may be turned on concurrently or substantially simultaneously with each other in response to the emission control signal EML transmitted through the emission control line EML, and may form a current path through which a driving current may flow in a direction from the first voltage line VDDL to the light-emitting element LED.

The seventh transistor T7 may be a second initialization transistor, and may be electrically connected to the second scan line SL2, the second initialization voltage line VIL2, and the sixth transistor T6. The seventh transistor T7 may be turned on in response to a second scan signal GB transmitted through the second scan line SL2, and may transmit the second initialization voltage Vaint from the second initialization voltage line VIL2 to a first electrode of the light-emitting element LED, thereby initializing the first electrode of the light-emitting element LED.

The ninth transistor T9 may be electrically connected to the second scan line SL2, the second electrode CE2 of the storage capacitor Cst, and the maintenance voltage line VSL. The ninth transistor T9 may be turned on in response to the second scan signal GB transmitted through the second scan line SL2, and may transmit the maintenance voltage VSUS to the second node N2, for example, such as to the second electrode CE2 of the storage capacitor Cst, in an initialization section and a data writing section.

Each of the eighth transistor T8 and the ninth transistor T9 may be electrically connected to the second node N2, for example, such as to the second electrode CE2 of the storage capacitor Cst. In some embodiments, in the initialization section and the data writing section, the eighth transistor T8 may be turned off, and the ninth transistor T9 may be turned on. In an emission section, the eighth transistor T8 may be turned on, and the ninth transistor T9 may be turned off. In the initialization section and the data writing section, the second node N2 may enhance a uniformity (e.g., a long range uniformity (LRU)) of a brightness of the display device according to a voltage drop of the first voltage line VDDL, because the maintenance voltage VSUS is transmitted to the second node N2.

The storage capacitor Cst may include the first electrode CE1 and the second electrode CE2. The first electrode CE1 may be electrically connected to the gate electrode of the first transistor T1, and the second electrode CE2 may be electrically connected to the eighth transistor T8 and the ninth transistor T9.

The auxiliary capacitor Ca may be electrically connected to the sixth transistor T6, the maintenance voltage line VSL, and the first electrode of the light-emitting element LED. The auxiliary capacitor Ca may store and maintain a voltage corresponding to a voltage difference between the first electrode of the light-emitting element LED and the maintenance voltage line VSL while the seventh transistor T7 and the ninth transistor T9 are turned on, thereby preventing or substantially preventing a black brightness from being increased when the sixth transistor T6 is turned off.

Figure 8A:
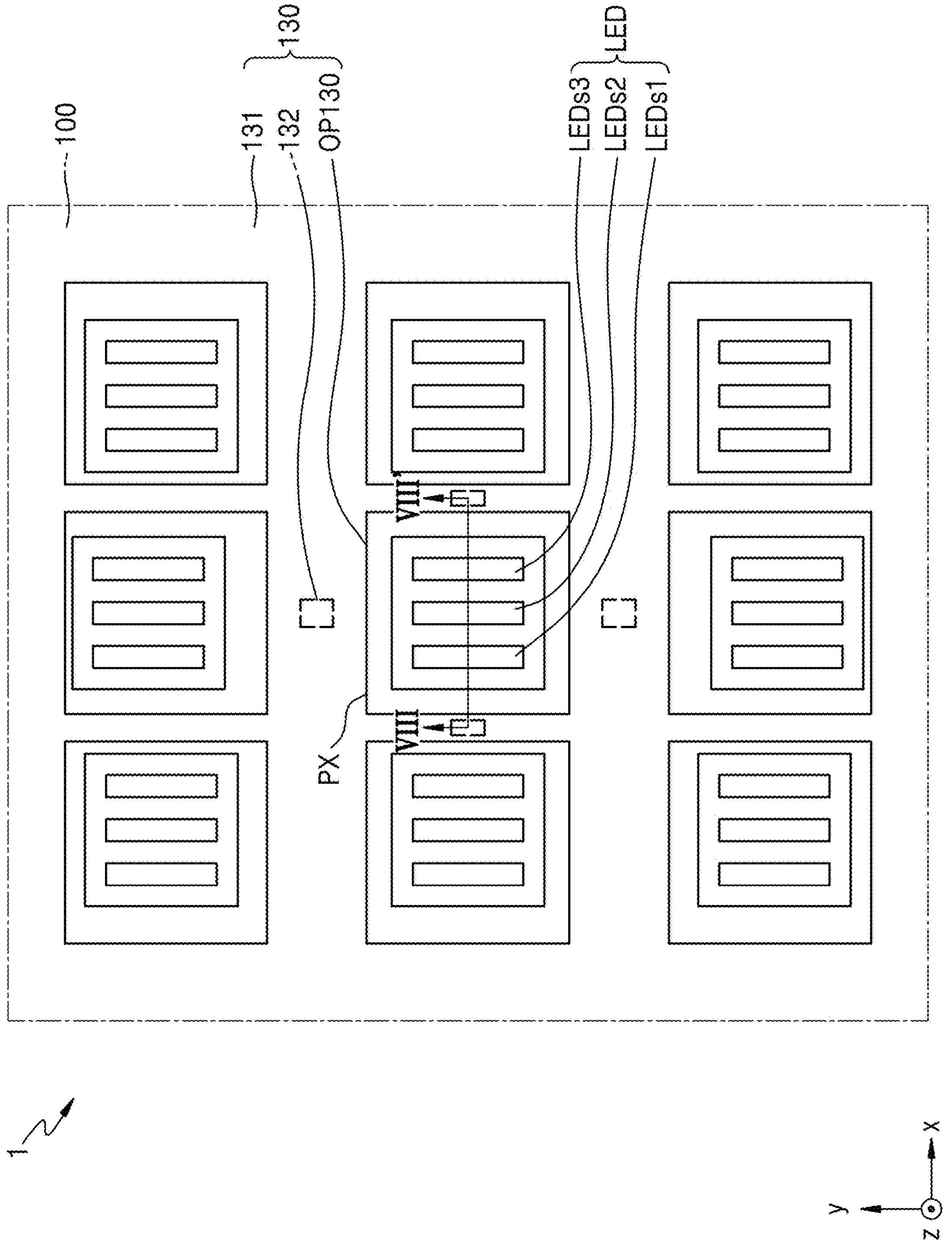
FIG. 8A is a plan view schematically illustrating a display device according to an embodiment.
Figure 8B:
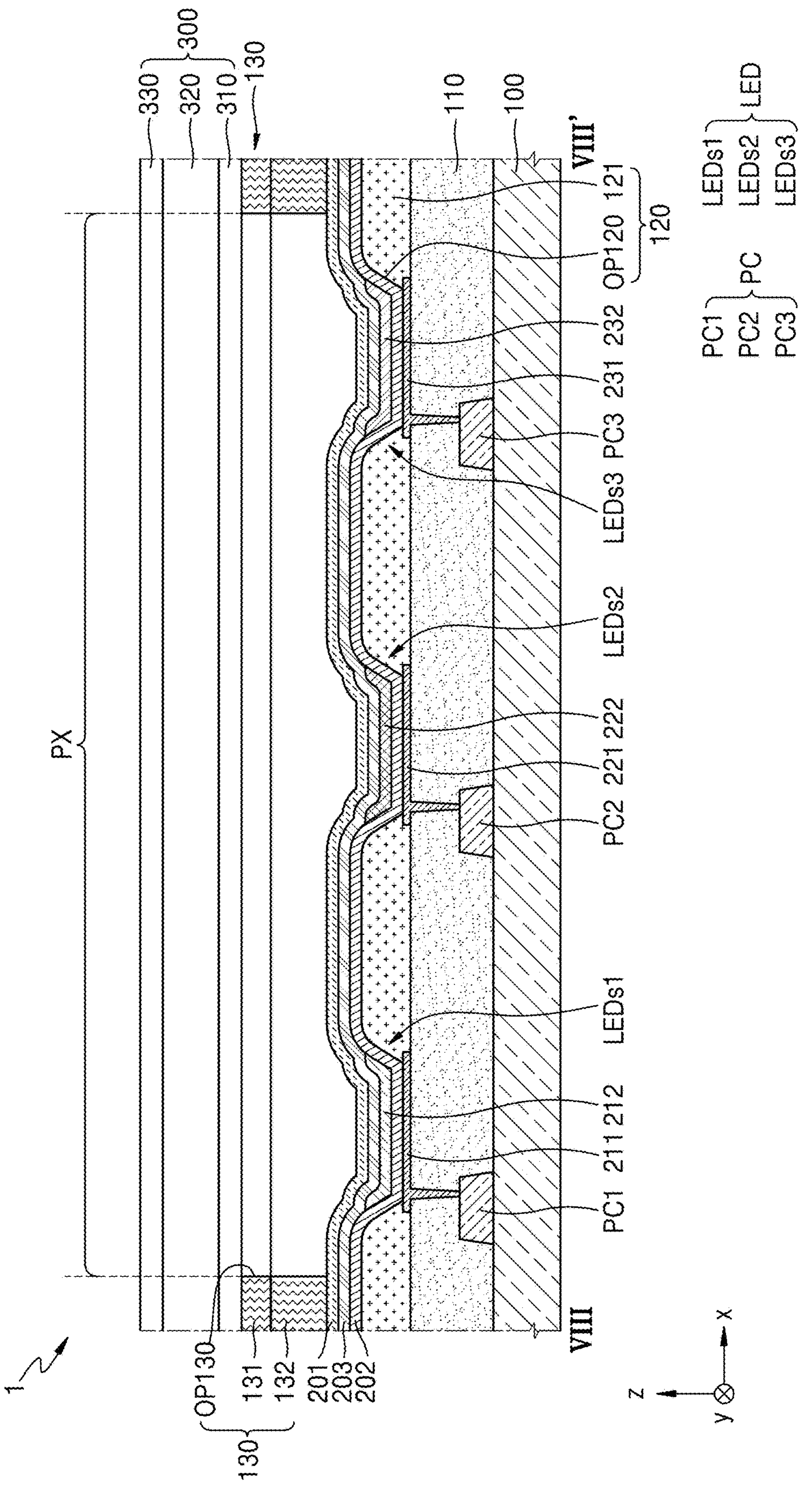
FIG. 8B is a cross-sectional view schematically illustrating a display device according to an embodiment.

FIG. 8A is a plan view schematically illustrating the display device 1 according to an embodiment. FIG. 8B is a cross-sectional view schematically illustrating the display device 1 according to an embodiment.

In more detail, FIG. 8A is an enlarged view of the region A of FIG. 3, and FIG. 8B is a cross-sectional view of the display device 1 taken along the line VIII-VIII' of FIG. 8A.

In FIGS. 8A and 8B, the same reference numerals as those described above with reference to FIGS. 4A and 4B are used to represent the same or substantially the same elements, and thus, redundant description thereof may not be repeated.

Referring to FIGS. 8A and 8B, the display device 1 may include a substrate 100, a circuit element layer 110, a light-emitting element LED, a bank layer 120, a cover layer 130, and an encapsulation layer 300.

The substrate 100 may be flexible, rollable, or bendable. The circuit element layer 110 may be arranged on the substrate 100. The circuit element layer 110 may include a pixel driving circuit portion PC. For example, the pixel driving circuit portion PC may include a first pixel driving circuit portion PC1, a second pixel driving circuit portion PC2, and a third pixel driving circuit portion PC3, which are arranged to be spaced apart from each other. The bank layer 120 may be disposed on the pixel element layer 110.

The light-emitting element LED may be arranged on the circuit element layer 110, and may be electrically connected to the pixel driving circuit portion PC. The light-emitting element LED may include a plurality of sub-light-emitting elements LED. For example, the light-emitting element LED may include a first sub-light-emitting element LEDs1, a second sub-light-emitting element LEDs2, and a third sub-light-emitting element LEDs3.

The first sub-light-emitting element LEDs1 may include a first pixel electrode 211, a first light-emitting layer 212, a common electrode 201, a first functional layer 202, and a second functional layer 203. The second sub-light-emitting element LEDs2 may include a second pixel electrode 221, a second light-emitting layer 222, the common electrode 201, the first functional layer 202, and the second functional layer 203. The third sub-light-emitting element LEDs3 may include a third pixel electrode 231, a third light-emitting layer 232, the common electrode 201, the first functional layer 202, and the second functional layer 203. The bank layer 120 may be arranged on the first through third pixel electrodes 211, 221, and 231. The bank layer 120 may include a cover portion 121 and a bank opening OP120.

The cover layer 130 may be arranged on the substrate 100. The cover layer 130 may be arranged on the common electrode 201 of the light-emitting element LED. The cover layer 130 may include a cover frame 131 and a cover opening OP130.

The cover frame 131 may be arranged on the substrate 100 to be spaced apart from the common electrode 201. The cover frame 131 may include an opaque material. For example, the cover frame 131 may include at least one of TPU, TPE, and/or a silicon rubber.

The support portion 132 may support the cover frame 131 from the substrate 100. The support portion 132 may be provided in a plurality. The plurality of support portions 132 may be spaced apart from each other. At least one of the plurality of support portions 132 may be arranged in the display area (e.g., see DA of FIG. 3). The support portions 132 arranged in the display area DA may reduce a phenomenon in which the cover frame 131 sags in the center of the display area (e.g., see DA of FIG. 3). In FIG. 8A, four support portions 132 are arranged to surround (e.g., around a periphery of) the cover opening OP130 disposed in the center of the display area (e.g., see DA of FIG. 3), but the present disclosure is not limited thereto, and the number and the arrangement of the support portions 132 may be variously modified as needed or desired.

One side of the support portion 132 may be fixed to the common electrode 201, and another side (e.g., an opposite side) of the support portion 132 may be fixed to the cover frame 131. The support portion 132 may include the same material as the material of the cover frame 131. For example, the support portion 132 may include at least one of TPU, TPE, and/or a silicon rubber. The support portion 132 and the cover frame 132 may be formed together as a single body.

The cover opening OP130 may be arranged on the cover frame 131. The cover opening OP130 may pass through (e.g., may penetrate) the cover frame 131. The cover opening OP130 may overlap with the light-emitting element LED. For example, one cover opening OP130 may overlap with all of the first sub-light-emitting element LEDs1, the second sub-light-emitting element LEDs2, and the third sub-light-emitting element LEDs3 of one light-emitting element LED. The light-emitting element LED may be exposed to the outside from the cover frame 131 through the cover opening OP130. Light emitted from the light-emitting element LED may be displayed to the outside through the cover opening OP130. Thus, the light-emitting element LED may be defined as a pixel PX.

The encapsulation layer 300 may be disposed on the substrate 100. The encapsulation layer 300 may be disposed on the cover layer 130. The encapsulation layer 300 may be supported by the cover layer 130. The encapsulation layer 300 may include at least one inorganic encapsulation layer and at least one organic encapsulation layer. In an example, the encapsulation layer 300 may include the first inorganic encapsulation layer 310, the organic encapsulation layer 320, and the second inorganic encapsulation layer 330, which are sequentially stacked, but the present disclosure is not limited thereto, and the encapsulation layer 300 may have various suitable configurations.

FIGS. 9A through 9G are perspective views schematically illustrating various electronic apparatuses including a display device according to one or more embodiments.

Figure 9A:
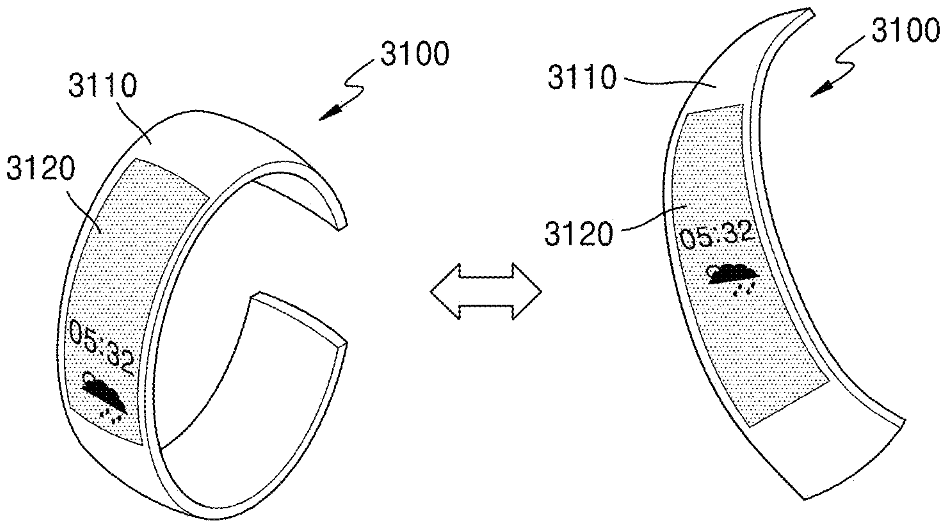
FIGS. 9A-9G are perspective views schematically illustrating various electronic apparatuses including a display device according to one or more embodiments.

Referring to FIG. 9A, the display device according to an embodiment may be used in a wearable electronic apparatus 3100 that is wearable on a part of the user's body. The wearable electronic apparatus 3100 may include a body unit (e.g., a body part) 3110, and a display unit (e.g., a display part) 3120 provided in the body unit 3110. The display device according to some embodiments may be used as the display unit 3120 of the wearable electronic apparatus 3100. As shown in FIG. 9A, the wearable electronic apparatus 3100 may be deformable. In an embodiment, the wearable electronic apparatus 3100 may be used as a smart watch or a smartphone according to the user's selection.

Figure 9B:
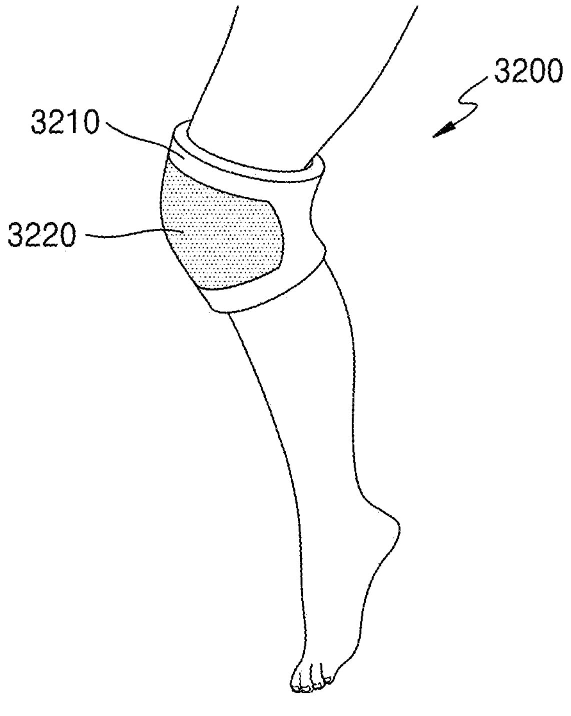

FIG. 9B illustrates a medical electronic apparatus 3200. In an embodiment, the medical electronic apparatus 3200 may include a body unit (e.g., a body part) 3210 and a light-emitting unit (e.g., a light-emitting part) 3220. The display device according to some embodiments may be used as the light-emitting unit 3220 of the medical electronic apparatus 3200. The light-emitting unit 3220 may emit light having a desired or certain wavelength band (e.g., infrared rays, visible rays, and/or the like) onto a patient's body. In an embodiment, the body unit 3210 may have a stretchable fiber material, and may have a structure that is wearable onto the body of the light-emitting unit's user.

Figure 9C:
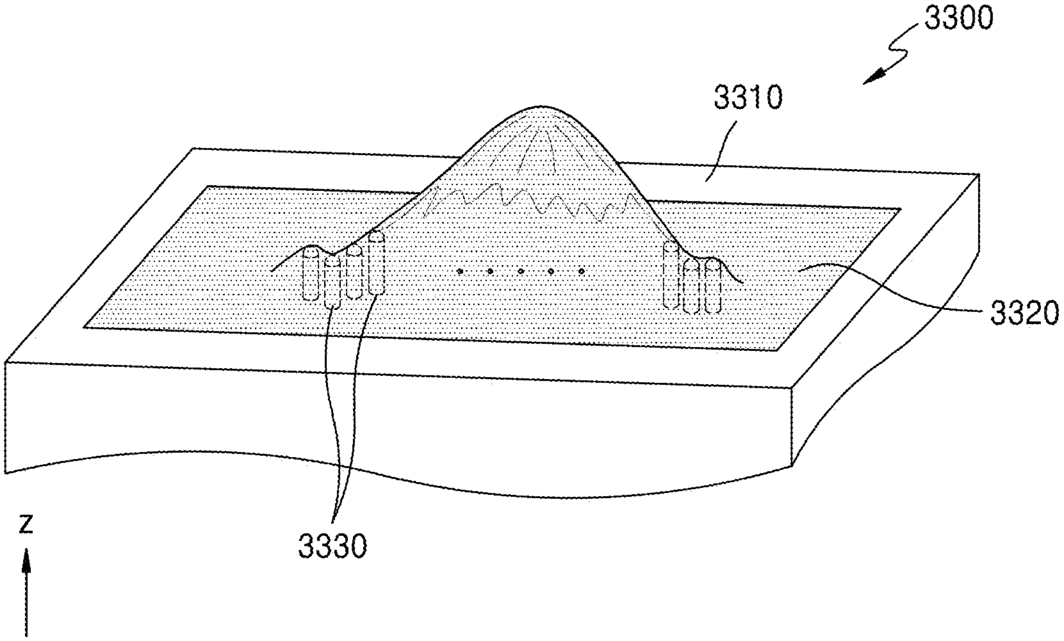

FIG. 9C illustrates an educational electronic apparatus 3300. In an embodiment, the educational electronic apparatus 3300 may include a display unit (e.g., a display part) 3320 provided in a frame 3310. The display unit 3320 may use a display device according to some embodiments. The display unit 3320 may provide an image, such as a sea striking the waves, a mountain covered with snow, or a volcano with lava, and in this case, the display unit 3320 may reflect the height of the waves, the mountains, or the volcanoes, and may be elongated in a height direction (e.g., the z direction). In some embodiments, a part of the display unit 3320 may show the movement of the lava in three dimensions when the height of the display unit 330 varies sequentially in the direction of the lava flow. The educational electronic apparatus 3300 may include a plurality of pins (e.g., strokes 3330) arranged on a rear surface of the display unit 3320, so that the display unit 3320 may be elongated in the height direction. As the plurality of pins 3330 move in the third direction (e.g., the z direction or a −z direction), images expressed on the display unit 330 may have a height in three dimensions.

FIG. 9C illustrates an educational electronic apparatus 3300, but in the case of an electronic apparatus capable of providing desired image information (e.g., certain or predetermined image information), the use of the electronic apparatus is not particularly limited thereto.

The electronic apparatuses shown in FIGS. 9A through 9C may have variable shapes, but the present disclosure is not limited thereto. A display device according to some embodiments may be used for an electronic apparatus with a unit (e.g., a screen) capable of expressing images thereon is fixed.

Figure 9D:
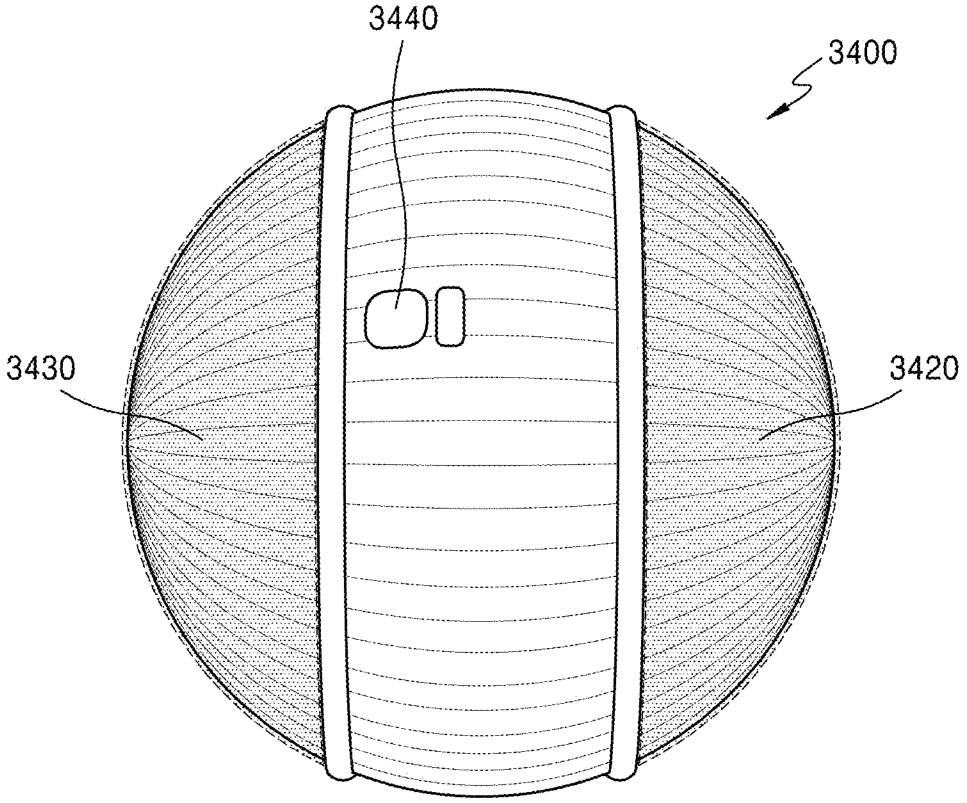

FIG. 9D illustrates a robot 3400 as the electronic apparatus according to an embodiment. The robot 3400 may recognize a movement or an object by using a camera unit (e.g., a camera) 3440, and may display a desired image (e.g., a certain or predetermined image) to the user through a display unit (e.g., a display part) 3420 or 3430. In some embodiments, the display devices according to an embodiment may be elongated in various directions, as described above, and may be assembled on a body frame having a semi-spherical shape. Thus, the robot 3400 may include spherical display units 3420 and 3430.

Figure 9E:
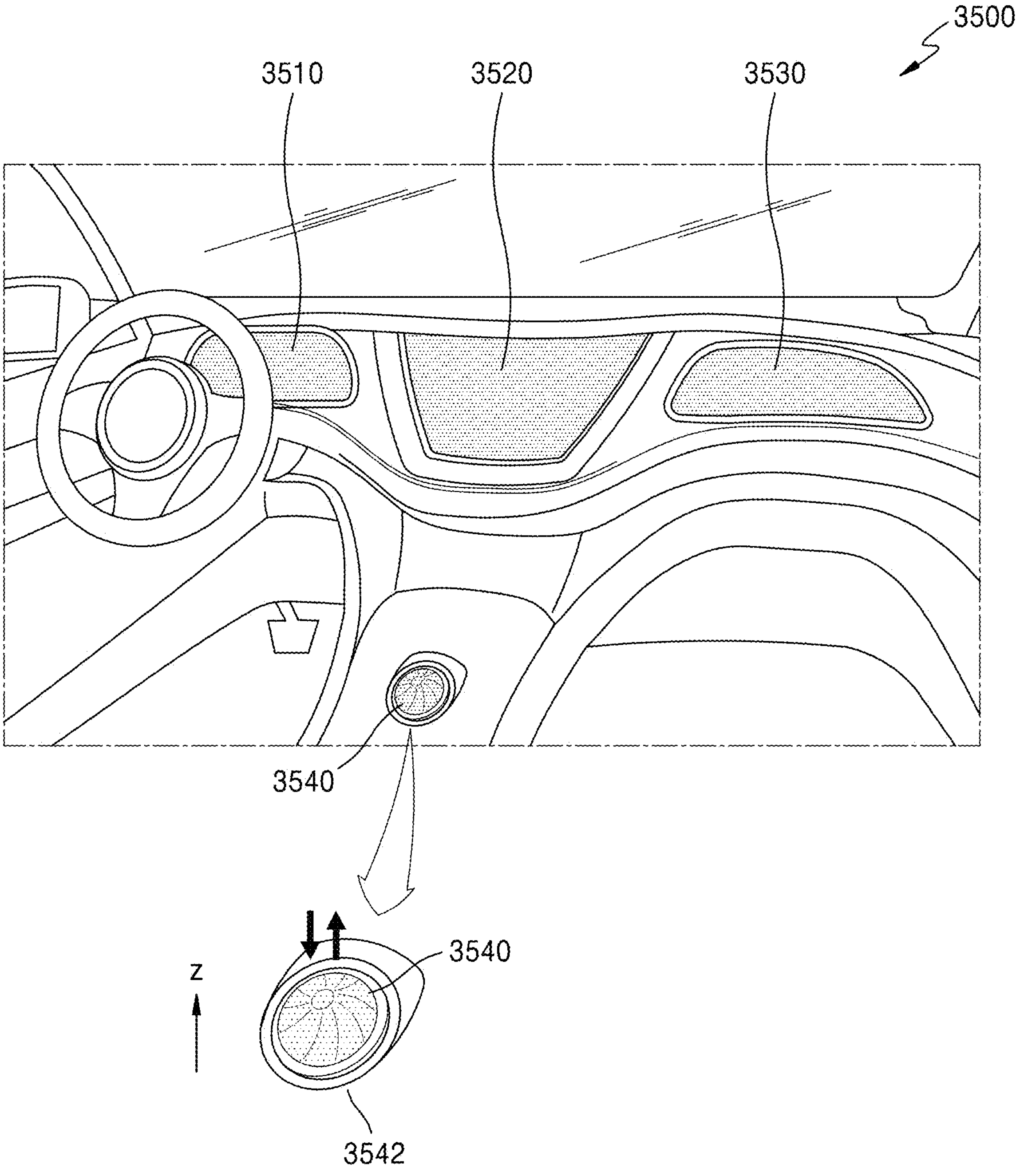

FIG. 9E illustrates a vehicle display apparatus 3500 as the electronic apparatus according to an embodiment. The vehicle display apparatus 3500 may include a cluster 3510, a center information display (CID) 3520, and/or a co-driver display 3530. The display device according to an embodiment may be elongated in various directions, and thus, may be used as the cluster 3510, the CID 3520, and/or the co-driver display 3530, while the display device is not limited by the shape of an inner frame of the vehicle.

FIG. 9E illustrates that the cluster 3510, the CID 3520, and/or the co-driver display 3530 are separated from each other, but the present disclosure is not limited thereto. In another embodiment, two or more selected from the cluster 350, the CID 3520, and/or the co-driver display 3530 may be connected to each other as a single body.

In some embodiments, the vehicle display apparatus 3500 may include a button 3540 that may express a desired image (e.g., a certain or predetermined image). Referring to the enlarged view in FIG. 9E, a semi-spherical button 3540 may include an object 3542 that provides a button use feeling while moving in the z direction or −z direction, and a display device disposed on the object 3542. In some embodiments, when the object 3542 has a three-dimensionally rounded surface, the display device may have a three-dimensionally rounded surface.

Figure 9F:
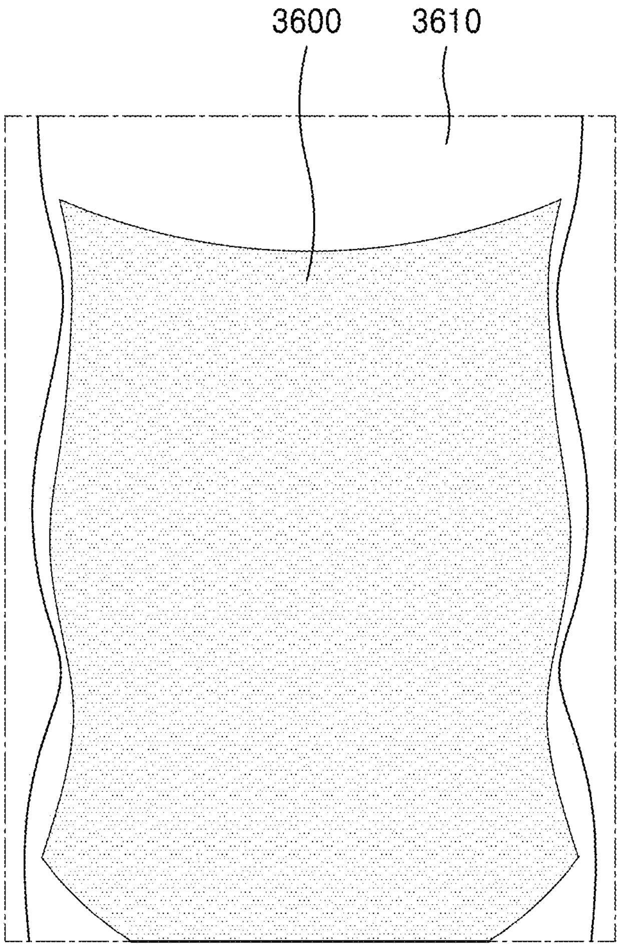

FIG. 9F illustrates that the electronic apparatus according to an embodiment is an advertising or exhibition electronic apparatus 3600. In some embodiments, the advertising or exhibition electronic apparatus 3600 may be installed on a fixed structure 3610, like a wall or a pillar. When the structure 3610 includes uneven surfaces, as shown in FIG. 9F, the advertising or exhibition electronic apparatus 3600 may be arranged along the uneven surfaces of the structure 3610. In some embodiments, the advertising or exhibition electronic apparatus 3600 may be installed on the structure 3610 by using a thermal contraction film or the like.

Figure 9G:
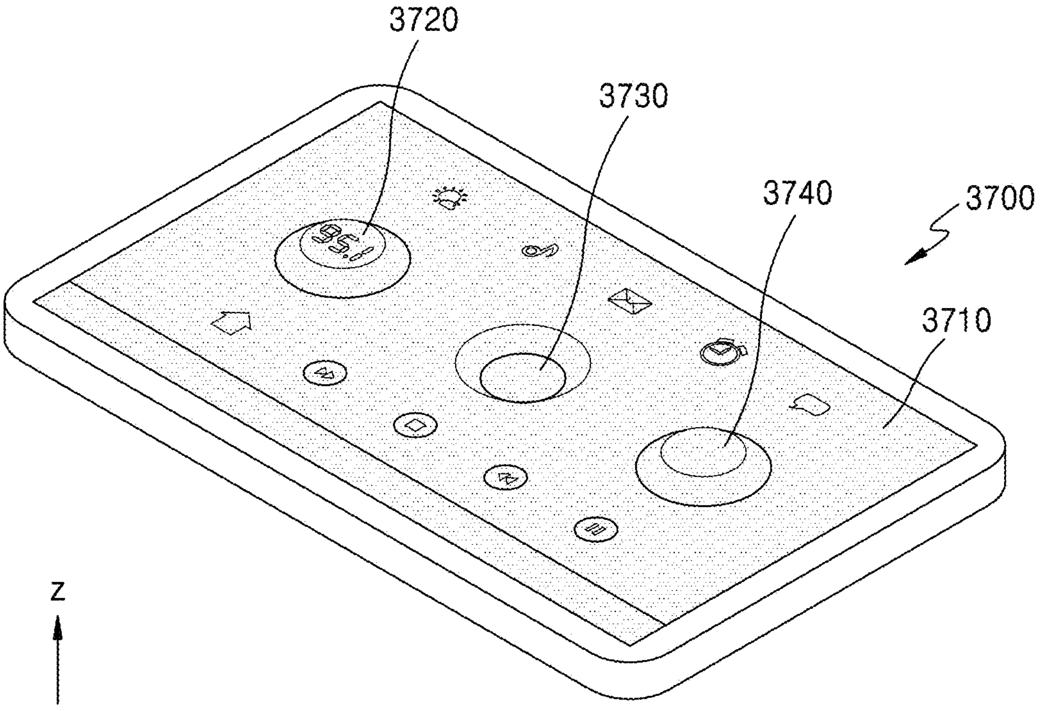

FIG. 9G illustrates a controller 3700 as the electronic apparatus according to an embodiment. The controller 3700 may include an image type button. For example, the controller 3700 may include first through third button areas 3720, 3730, and 3740, in which partial regions of the display unit 3710 protrude in the z direction or −z direction (or recessed in the z direction). In some embodiments, the first button area 3720 and third button area 3740 may protrude in the z direction, and the second button area 3730 may protrude in the −z direction (or may be recessed in the z direction).

According to some embodiments described above, a display apparatus having enhanced visibility and durability may be provided.

However, the present disclosure is not limited thereto.

The foregoing is illustrative of some embodiments of the present disclosure, and is not to be construed as limiting thereof. Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
- a display area and a non-display area;
- a substrate;
- a plurality of light-emitting elements on the substrate; and
- a cover layer comprising:
  - a cover frame on the substrate, and comprising an opaque material; and
  - a plurality of cover openings in the cover frame to overlap with the plurality of light-emitting elements,
- wherein the plurality of light-emitting elements are located at different intervals, and the plurality of cover openings are located at equal intervals.

2. The display device of claim 1, wherein the plurality of cover openings are located symmetrically with respect to a first center line and a second center line, the first center line being a virtual center line passing through a center of the display area in a first direction, and the second center line being a virtual center line passing through the center of the display area in a second direction crossing the first direction.

3. The display device of claim 2, wherein the plurality of light-emitting elements comprises:
- a plurality of first light-emitting elements linearly located along the first center line; and
- a plurality of second light-emitting elements spaced from the first center line in the second direction, and linearly located along a first line, the first line being a virtual line convex in the second direction.

4. The display device of claim 3, wherein a distance between the first center line and the first line decreases gradually along the first direction based on the second center line.

5. The display device of claim 3, wherein the plurality of light-emitting elements further comprises a plurality of third light-emitting elements linearly located along a second line, the second line being a virtual line symmetrical with respect to the first line based on the first center line.

6. The display device of claim 1, wherein a modulus of the cover frame is less than a modulus of the substrate.

7. The display device of claim 1, wherein, in a plan view, a size of each of the plurality of cover openings is greater than a size of each of the plurality of light-emitting elements.

8. The display device of claim 1, wherein the cover layer further comprises a support portion to support the cover frame from the substrate.

9. The display device of claim 8, wherein the support portion comprises a plurality of support portions, and at least one of the plurality of support portions is located in the display area.

10. The display device of claim 1, wherein the cover frame comprises at least one of a thermoplastic polyurethane (TPU), a thermoplastic polyethylene (TPE), or a silicon rubber.

11. A display device configured to be converted between a first structure and a second structure extending from the first structure, comprising:
- a substrate;
- a plurality of light-emitting elements on the substrate; and
- a cover layer comprising:
  - a cover frame on the substrate, and comprising an opaque material; and
  - a plurality of cover openings located in the cover frame to overlap with the plurality of light-emitting elements,
- wherein, in the second structure, a distance between the plurality of light-emitting elements is uniform in comparison with that of the first structure.

12. The display device of claim 11, wherein the plurality of light-emitting elements comprises:
- a plurality of first light-emitting elements linearly located along a first center line, the first center line being a virtual center line extending in a first direction; and
- a plurality of second light-emitting elements spaced from the first center line in a second direction crossing the first direction, and linearly located along a first line, the first line being a virtual line convex in the second direction.

13. The display device of claim 12, wherein, in the second structure, a curvature of the first line decreases in comparison with that of the first structure.

14. The display device of claim 12, wherein, in the second structure, a distance between the first center line and the first line decreases in comparison with that of the first structure.

15. The display device of claim 12, wherein the plurality of light-emitting elements further comprises a plurality of third light-emitting elements linearly located along a second line, the second line being a virtual line symmetrical with respect to the first line based on the first center line.

16. The display device of claim 11, wherein a modulus of the cover frame is less than a modulus of the substrate.

17. The display device of claim 11, wherein, in a plan view, a size of each of the plurality of cover openings is greater than a size of each of the plurality of light-emitting elements.

18. The display device of claim 11, wherein the cover layer further comprises a support portion to support the cover frame from the substrate.

19. The display device of claim 18, wherein the support portion comprises a plurality of support portions spaced apart from each other.

20. The display device of claim 11, wherein the cover frame comprises at least one of a thermoplastic polyurethane (TPU), a thermoplastic polyethylene (TPE), or a silicon rubber.

* * * * *